United States Patent
Daigo et al.

(10) Patent No.: US 11,299,821 B2
(45) Date of Patent: Apr. 12, 2022

(54) VAPOR PHASE GROWTH APPARATUS AND VAPOR PHASE GROWTH METHOD

(71) Applicant: NuFlare Technology, Inc., Yokohama (JP)

(72) Inventors: Yoshiaki Daigo, Yokohama (JP); Akio Ishiguro, Yokohama (JP); Hideki Ito, Yokohama (JP)

(73) Assignee: NuFlare Technology, Inc., Kanagawa (JP)

( * ) Notice: Subject to any disclaimer, the term of this patent is extended or adjusted under 35 U.S.C. 154(b) by 47 days.

(21) Appl. No.: 16/781,261

(22) Filed: Feb. 4, 2020

(65) Prior Publication Data

US 2020/0190692 A1 Jun. 18, 2020

Related U.S. Application Data

(63) Continuation of application No. PCT/JP2018/029783, filed on Aug. 8, 2018.

(30) Foreign Application Priority Data

Sep. 1, 2017 (JP) .............................. JP2017-168508

(51) Int. Cl.
*H01L 21/44* (2006.01)
*C30B 25/12* (2006.01)
(Continued)

(52) U.S. Cl.
CPC ............ *C30B 25/12* (2013.01); *C23C 16/325* (2013.01); *C23C 16/4584* (2013.01);
(Continued)

(58) Field of Classification Search
CPC ......... H01L 21/02529; H01L 21/02576; H01L 21/0262; H01L 29/1608; H01L 29/167;
(Continued)

(56) References Cited

U.S. PATENT DOCUMENTS 5,884,009 A 3/1999 Okase
6,113,705 A 9/2000 Ohashi et al.
(Continued)

FOREIGN PATENT DOCUMENTS

EP 0854210 A1 7/1998
JP 2010-037157 A 2/2010
(Continued)

OTHER PUBLICATIONS

Supplementary Partial European Search Report dated Apr. 6, 2021 issued in the corresponding European Patent Application No. 18849841.4.

(Continued)

*Primary Examiner* — Brook Kebede
(74) *Attorney, Agent, or Firm* — Rankin, Hill & Clark LLP

(57) ABSTRACT

A vapor phase growth apparatus according to an embodiment includes a reaction chamber; a substrate holder having a holding wall capable holding an outer periphery of the substrate; a process gas supply part provided above the reaction chamber, the process gas supply part having a first region supplying a first process gas and a second region around the first region supplying a second process gas having a carbon/silicon atomic ratio higher than that of the first process gas, an inner peripheral diameter of the second region being 75% or more and 130% or less of a diameter of the holding wall; a sidewall provided between the process gas supply part and the substrate holder, an inner peripheral diameter of the sidewall being 110% or more and 200% or less of an outer peripheral diameter of the second region; a first heater; a second heater; and a rotation driver.

5 Claims, 11 Drawing Sheets

(51) Int. Cl.

| | |
|---|---|
| *C23C 16/32* | (2006.01) |
| *C23C 16/458* | (2006.01) |
| *C23C 16/46* | (2006.01) |
| *C23C 28/04* | (2006.01) |
| *C30B 25/10* | (2006.01) |
| *C30B 25/14* | (2006.01) |
| *C30B 29/36* | (2006.01) |
| *C30B 29/68* | (2006.01) |
| *H01L 21/02* | (2006.01) |
| *H01L 29/16* | (2006.01) |
| *H01L 29/167* | (2006.01) |
| *C30B 25/16* | (2006.01) |
| *C23C 16/455* | (2006.01) |

(52) U.S. Cl.
CPC .............. *C23C 16/46* (2013.01); *C23C 28/04* (2013.01); *C30B 25/10* (2013.01); *C30B 25/14* (2013.01); *C30B 29/36* (2013.01); *C30B 29/68* (2013.01); *H01L 21/0262* (2013.01); *H01L 21/02529* (2013.01); *H01L 21/02576* (2013.01); *H01L 29/167* (2013.01); *H01L 29/1608* (2013.01); *C23C 16/455* (2013.01); *C30B 25/165* (2013.01)

(58) Field of Classification Search
CPC ......... C30B 25/10; C30B 25/14; C30B 25/12; C30B 29/36; C30B 29/68; C23C 16/325; C23C 16/4584; C23C 16/46; C23C 28/04
USPC .................................................. 438/680, 758
See application file for complete search history.

(56) References Cited

U.S. PATENT DOCUMENTS

| | | |
|---|---|---|
| 2011/0171380 A1 | 7/2011 | Higashi et al. |
| 2012/0052659 A1 | 3/2012 | Moriyama et al. |
| 2012/0244684 A1 | 9/2012 | Suzuki et al. |
| 2013/0102132 A1* | 4/2013 | Takeda ................ C23C 16/4408 438/478 |
| 2013/0247816 A1 | 9/2013 | Suzuki et al. |
| 2014/0209015 A1* | 7/2014 | Yamada ............ C23C 16/45574 117/98 |
| 2015/0090693 A1 | 4/2015 | Ito et al. |
| 2016/0138190 A1 | 5/2016 | Fujibayashi et al. |

FOREIGN PATENT DOCUMENTS

| | | |
|---|---|---|
| JP | 2011-14682 A | 1/2011 |
| JP | 2012-54327 A | 3/2012 |
| JP | 2013-128086 A | 6/2013 |
| JP | 5265985 B2 | 8/2013 |
| JP | 2013-225665 A | 10/2013 |
| JP | 2015-5658 A | 1/2015 |
| JP | 2015-73000 A | 4/2015 |
| JP | 2015-191960 A | 11/2015 |
| WO | 2005/021842 A2 | 3/2005 |

OTHER PUBLICATIONS

Japanese Office Action dated Aug. 25, 2020 issued in the corresponding Japanese Patent Application No. 2019-539147 and its English translation.
Taiwanese Office Action dated Mar. 28, 2019 issued in Taiwanese patent application No. 107128907 and its English machine translation.
International Search Report (ISR) issued in PCT/JP2018/029783 dated Sep. 11, 2018.
Rong et al., "Modeling of Chemical Vapor Deposition of Large-Area Silicon Carbide Thin Film", Crystal Growth & Design, Nov. 2006, vol. 6, No. 11, pp. 2592-2597; Cited in EESR.
Wagner et al., "Vapour phase growth of epitaxial silicon carbide layers", Progress in Crystal Growth and Characterization of Materials, Elsevier, 2003, vol. 47, pp. 139-165; Cited in EESR.
Extended European Search Report (EESR) dated Aug. 16, 2021 for the European Patent Application No. 18849841.4.

* cited by examiner

VAPOR PHASE GROWTH APPARATUS AND VAPOR PHASE GROWTH METHOD

CROSS-REFERENCE TO RELATED APPLICATION

This application is continuation application of, and claims the benefit of priority from the International Application PCT/JP2018/29783, filed Aug. 8, 2018, which claims the benefit of priority from Japanese Patent Application No. 2017-168508, filed on Sep. 1, 2017, the entire contents of all of which are incorporated herein by reference.

FIELD OF THE INVENTION

The invention relates to a vapor phase growth apparatus and a vapor phase growth method for forming a film by supplying gases.

BACKGROUND OF THE INVENTION

As a method for forming a high quality semiconductor film, there is an epitaxial growth technique for growing a single crystal film by vapor phase growth on a substrate such as a wafer. In a vapor phase growth apparatus using the epitaxial growth technique, the wafer is mounted on a substrate holder in a reaction chamber that is maintained at an atmospheric pressure or a reduced pressure.

Then, while heating the wafer, process gases such as source gases which are raw materials for film formation are supplied from an upper portion of the reaction chamber to the wafer surface in the reaction chamber. Thermal reaction of the source gases occurs in the wafer surface, so that an epitaxial single crystal film is formed on the wafer surface.

In some cases, impurities which become dopants may be introduced into the epitaxial single crystal film. In order to obtain a uniform resistance distribution of the epitaxial single crystal film, it is necessary to make the concentration distribution of the impurity to be uniform.

Patent Document 1 discloses a method of supplying process gases with different carbon (C)/silicon (Si) ratios to the central portion and the outer peripheral portion of the substrate in order to obtain a uniform concentration distribution of the impurity in the formation of the epitaxial single crystal film of silicon carbide (SiC).

SUMMARY OF THE INVENTION

According to an aspect of the invention, there is provided a vapor phase growth apparatus including: a reaction chamber; a substrate holder provided in the reaction chamber, a substrate capable of being mounted on the substrate holder, the substrate holder having a holding wall capable of holding an outer periphery of the substrate with a predetermined gap; a process gas supply part provided above the reaction chamber, the process gas supply part having a first region capable of supplying a first process gas to the reaction chamber and a second region provided around the first region and capable of supplying a second process gas having a carbon/silicon atomic ratio higher than that of the first process gas to the reaction chamber, an inner peripheral diameter of the second region being 75% or more and 130% or less of a diameter of the holding wall; a sidewall provided at a region between the process gas supply part and the substrate holder in the reaction chamber, an inner peripheral diameter of the sidewall being 110% or more and 200% or less of an outer peripheral diameter of the second region; a first heater provided below the substrate holder; a second heater provided between the sidewall and an inner wall of the reaction chamber; and a rotation driver rotating the substrate holder.

According to an aspect of the invention, there is provided a vapor phase growth method including: rotating a substrate at a rotational speed of 300 rpm or more; heating the substrate; supplying a first process gas at a first flow rate toward the substrate; supplying a second process gas having a carbon/silicon atomic ratio higher than that of the first process gas at a second flow rate toward the substrate in a region on an outer side than the first process gas; and forming a silicon carbide film on a surface of the substrate by forming a flow of the second process gas to be pulled in a direction toward a center of the substrate by controlling the first flow rate, the second flow rate, and the rotational speed.

According to another aspect of the invention, there is provided a vapor phase growth method including: rotating a substrate at a rotational speed of 300 rpm or more; heating the substrate; supplying a first process gas containing carbon, silicon, and an n-type impurity toward the substrate; supplying a second process gas containing carbon, silicon, and an n-type impurity and having a carbon/silicon atomic ratio of the second process gas higher than that of the first process gas toward the substrate in a region on an outer side than a region being supplied with the first process gas; forming a first silicon carbide film on a surface of the substrate in a state of an effective carbon/silicon atomic ratio of the process gas just above the surface of the substrate being less than 1; supplying a third process gas containing carbon, silicon, and an n-type impurity toward the substrate; supplying a fourth process gas containing carbon, silicon, and an n-type impurity and having a carbon/silicon atomic ratio higher than that of the third process gas toward the substrate in a region on an outer side than a region being supplied with the third process gas; and forming a second silicon carbide film having an n-type impurity concentration lower than that of the first silicon carbide film on the surface of the substrate in a state of the effective carbon/silicon atomic ratio of the process gas just above the surface of the substrate being 1 or more.

DETAILED DESCRIPTION OF THE EMBODIMENTS

Figure 1:
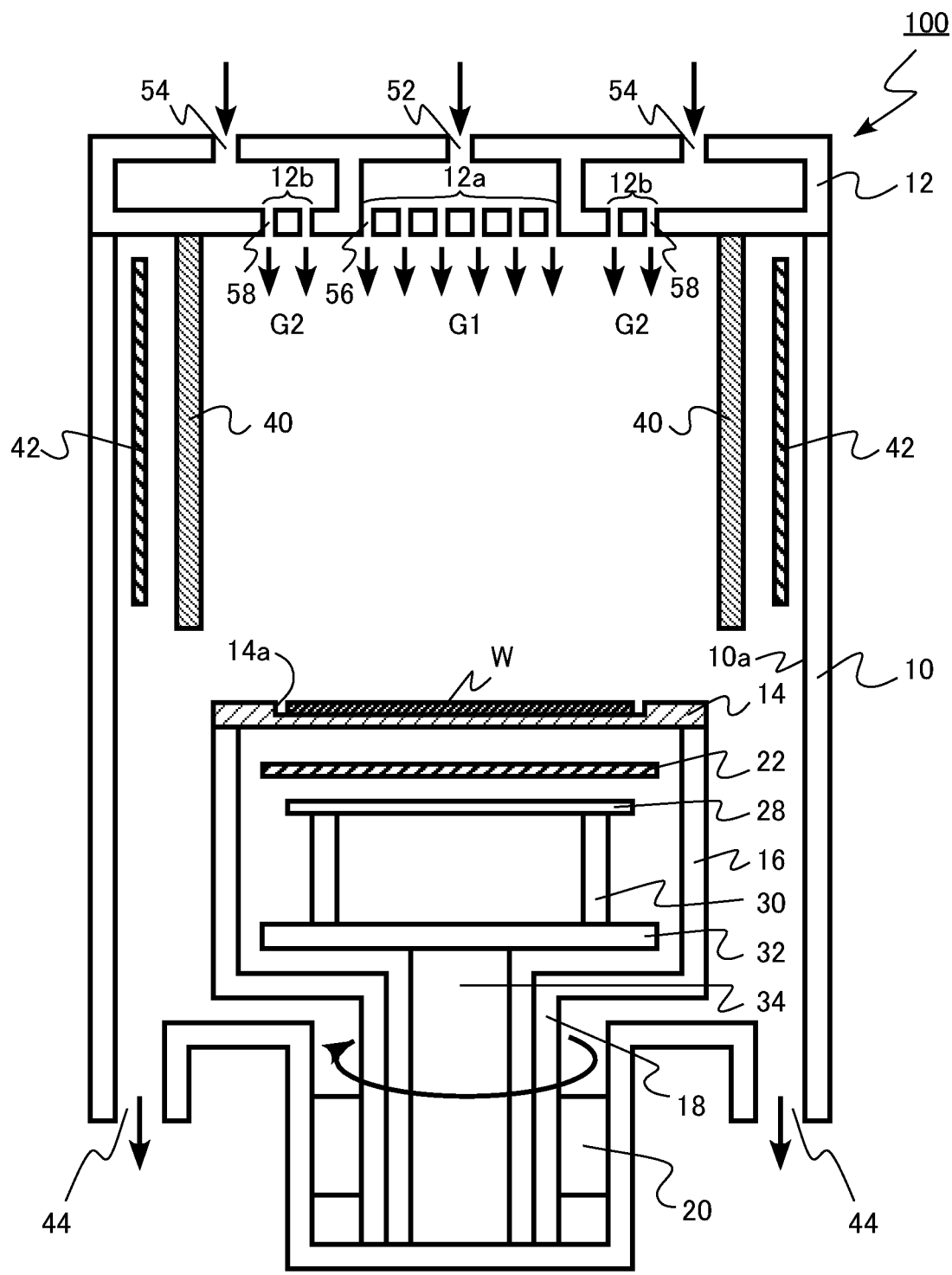
FIG. 1 is a schematic cross-sectional view of a vapor phase growth apparatus according to the first embodiment.

Hereinafter, embodiments of the invention will be described with reference to the drawings.

In this specification, in some cases, the same or similar components are denoted by the same reference numerals.

In this specification, the gravity direction in a state in which the vapor phase growth apparatus is provided so as to performing film formation is defined as "down", and the opposite direction is defined as "up". Accordingly, "lower" denotes a position in the direction of gravity with respect to a reference, and "downward" denotes the direction of gravity with respect to the reference. Then, "upper" denotes a position in the direction opposite to the direction of gravity with respect to the reference, and "upward" denotes the direction opposite to the direction of gravity with respect to the reference. In addition, the "vertical direction" is the direction of gravity.

In addition, in this specification, the term "process gas" is a general term for gases used for forming a film on a substrate and conceptually includes, for example, a source gas, an assist gas, a dopant gas, a carrier gas, and a mixture thereof.

First Embodiment

A vapor phase growth apparatus according to a first embodiment includes: a reaction chamber; a substrate holder being provided in the reaction chamber, a substrate capable of being mounted on the substrate holder, the substrate holder having a holding wall capable holding an outer periphery of the substrate with a predetermined gap; a process gas supply part being provided above the reaction chamber, the process gas supply part having a first region capable of supplying a first process gas to the reaction chamber and a second region being provided around the first region and being capable of supplying a second process gas having a carbon/silicon atomic ratio higher than that of the first process gas to the reaction chamber, an inner peripheral diameter of the second region being 75% or more and 130% or less of a diameter of the holding wall; a sidewall being provided to a region between the process gas supply part and the substrate holder in the reaction chamber, an inner peripheral diameter being 110% or more and 200% or less of an outer peripheral diameter of the second region; a first heater provided below the substrate holder; a second heater provided between the sidewall and an inner wall of the reaction chamber; and a rotation driver rotating the substrate holder.

In addition, a vapor phase growth method according to the first embodiment includes: rotating a substrate at a rotational speed of 300 rpm or more; heating the substrate; supplying a first process gas at a first flow rate toward the substrate; supplying a second process gas having a carbon/silicon atomic ratio higher than that of the first process gas at a second flow rate toward the substrate in a region on an outer side than the first process gas; and forming a silicon carbide film on a surface of the substrate by forming a flow of the second process gas to be pulled in a direction toward a center of the substrate by controlling the first flow rate, the second flow rate, and the rotational speed.

FIG. 1 is a schematic cross-sectional view of the vapor phase growth apparatus according to the first embodiment. The vapor phase growth apparatus 100 according to the first embodiment is, for example, a single wafer type epitaxial growth apparatus of performing epitaxial growth of a single crystal SiC film on a single crystal SiC substrate.

The vapor phase growth apparatus 100 according to the first embodiment includes a reaction chamber 10 and a process gas supply part 12. The reaction chamber 10 includes a susceptor 14 (substrate holder), a rotating body 16, a rotation shaft 18, a rotation driver 20, a first heater 22, a reflector 28, support posts 30, a fixing base 32, a fixed shaft 34, a hood 40 (sidewall), a second heater 42, and a gas outlet 44. The process gas supply part 12 includes a first gas supply port 52, a second gas supply port 54, first gas ejection holes 56, and the second gas ejection holes 58. A circular region in which the first gas ejection holes 56 of the process gas supply part 12 are provided is a first region 12a, and an annular region in which the second gas ejection holes 58 are provided is a second region 12b.

Hereinafter, a case where a single crystal SiC film is epitaxially grown on a single crystal SiC wafer by using the vapor phase growth apparatus 100 will be described as an example.

The process gas supply part 12 is provided above the reaction chamber 10. The process gas supply part 12 has a function of supplying process gases into the reaction chamber 10.

The first gas supply port 52 and the second gas supply port 54 are provided in the upper portion of the process gas supply part 12. The first gas supply port 52 supplies, for example, a first process gas G1 into the process gas supply part 12. The second gas supply port 54 supplies, for example, a second process gas G2 in to the process gas supply part 12.

The first gas ejection holes 56 and the second gas ejection holes 58 are provided in the lower portion of the process gas supply part 12. The first gas ejection holes 56 and the second gas ejection holes 58 are provided to face the reaction chamber 10.

The second gas ejection holes 58 are provided around the first gas ejection holes 56. The region in which the first gas ejection holes 56 of the process gas supply part 12 are provided is the first region 12a, and the region in which the second gas ejection holes 58 are provided is the second region 12b. Therefore, the second region 12b is provided around the first region 12a.

The first process gas G1 is supplied from the first gas ejection holes 56 into the reaction chamber 10. The second process gas G2 is supplied from the second gas ejection holes 58 into the reaction chamber 10. In other words, the first process gas G1 is supplied from the first region 12a into the reaction chamber 10, and the second process gas G2 is supplied from the second region 12b into the reaction chamber 10.

The process gas supply part 12 is provided with the first region 12a and second region 12b, and thus, the process gases having different compositions at different flow rates can be supplied to the central portion and the outer peripheral portion of the wafer W, respectively. In addition, in this specification, a flow rate is defined as a value obtained by dividing a gas flow rate introduced from a gas supply port or a value obtained by dividing a gas flow rate passing through a gas ejection hole by a cross-sectional area of the corresponding gas ejection hole.

The first process gas G1 is, for example, a mixed gas containing a source gas of silicon (Si), a source gas of carbon (C), a dopant gas of n-type impurity, an assist gas of suppressing clustering of silicon, and a carrier gas. The source gas of silicon is, for example, silane ($SiH_4$). The source gas of carbon is, for example, propane ($C_3H_8$). The dopant gas of n-type impurity is, for example, a nitrogen gas. The assist gas is, for example, hydrogen chloride (HCl). The carrier gas is, for example, an argon gas or a hydrogen gas.

The second process gas G2 is, for example, a mixed gas containing a source gas of silicon, a source gas of carbon, a dopant gas of n-type impurities, an assist gas, and a carrier gas. The source gas of silicon is, for example, silane. The source gas of carbon is, for example, propane. The dopant gas of the n-type impurities is, for example, a nitrogen gas. The assist gas is, for example, hydrogen chloride (HCl). The carrier gas is, for example, an argon gas or a hydrogen gas.

A carbon/silicon atomic ratio (hereinafter, also referred to as a C/Si ratio) of the second process gas G2 is higher than the carbon/silicon atomic ratio of the first process gas G1. For example, by making the ratio of the source gas of silicon to the source gas of carbon contained in the second process gas G2 to be lower than the rate of the source gas of silicon to the source gas of carbon contained in the first process gas G1, the C/Si ratio of the second process gas G2 can be made to be higher than the C/Si ratio of the first process gas G1. In addition, for example, by making the second process gas G2 not to contain the source gas of silicon and making the source gas to be only the source gas of carbon, the C/Si ratio of the second process gas G2 can be made to be higher than the C/Si ratio of the first process gas G1.

In addition, herein, described is an embodiment in which, before the process gases are supplied to the process gas supply part 12, all the process gases are mixed, and then, the first process gas G1 and the second process gas G2 are taken. However, an embodiment in which the process gases are mixed in the process gas supply part 12 or an embodiment in which the process gases are mixed after being supplied to the reaction chamber 10 may be used.

For example, all or a portion of the source gas of silicon, the source gas of carbon, the dopant gas of n-type impurity, and the assist gas may be separated by the time when these gases are supplied to the reaction chamber 10.

For example, by providing a plurality of types of gas ejection holes as the first gas ejection holes 56, it is possible to supply different types of process gases from the respective gas ejection holes. The same applies to the second gas ejection holes 58.

Figure 2:
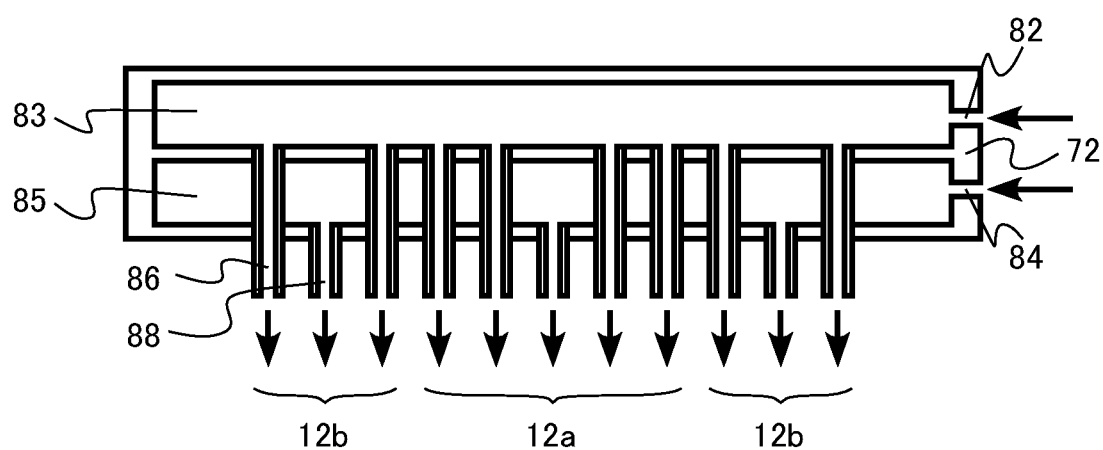
FIG. 2 is a schematic cross-sectional view illustrating another specific example of a process gas supply part according to the first embodiment.

FIG. 2 is a schematic cross-sectional view illustrating another specific example of the process gas supply part according to the first embodiment. The process gas supply part 72 includes a silicon source gas supply port 82, a carbon source gas supply port 84, a first separated chamber 83, a second separated chamber 85, silicon source gas ejection holes 86, and carbon source gas ejection holes 88. In the case of using the process gas supply part 72, the source gas of silicon and the source gas of carbon are mixed after being supplied to the reaction chamber 10.

In such a configuration, by adjusting the flow rate of the gases supplied to the carbon source gas ejection holes 88 and the silicon source gas ejection holes 86, it is possible to change the C/Si ratio of the gas flow into the reaction chamber 10. In addition, by changing the densities (the number of gas ejection holes per unit area) of the carbon source gas ejection holes 88 and the silicon source gas ejection holes 86 in the first region 12a and the second region 12b, it is possible to change the C/Si ratios in the first region 12a and the second region 12b (to make the C/Si ratio in the second region 12b to be higher than C/Si ratio in the first region 12a). In addition, for example, by adjusting the cross-sectional areas of the carbon source gas ejection holes 88 and the cross-sectional areas of the silicon source gas ejection holes 86 in the first region 12a and second region 12b, it is possible to change the C/Si ratios in the first region 12a and the second region 12b (to make the C/Si ratio in the second region 12b to be higher than C/Si ratio in the first region 12a).

The reaction chamber 10 is made of, for example, stainless steel. The reaction chamber 10 has a cylindrical inner wall 10a. In the reaction chamber 10, an SiC film is formed on the wafer W.

The susceptor 14 is provided inside the reaction chamber 10. The wafer W which is an example of the substrate can be mounted on the susceptor 14. An opening may be provided in the central portion in the susceptor 14.

The susceptor 14 has a holding wall 14a which can hold the outer periphery of the wafer W with a predetermined gap. Due to the holding wall 14a, the horizontal movement of the wafer W is restricted. The difference between the diameter of the holding wall 14a and the diameter of the wafer W is, for example, 3 mm or less.

The susceptor 14 is made of a material having high heat resistance, for example, SiC, a carbon, a carbon coated with SiC or TaC, or the like.

The susceptor 14 is fixed to the upper portion of the rotating body 16. The rotating body 16 is fixed to the rotation shaft 18. The susceptor 14 is fixed indirectly to the rotation shaft 18.

The rotation shaft 18 can be rotated by the rotation driver 20. By rotating the rotation shaft 18 by the rotation driver 20, it is possible to rotate the susceptor 14. By rotating the susceptor 14, it is possible to rotate the wafer W mounted on the susceptor 14.

For example, the wafer W is rotated at a rotational speed of 300 rpm or more and 3000 rpm or less. The rotation driver 20 is configured to include, for example, a motor and bearings.

The first heater 22 is provided below the susceptor 14. The first heater 22 is provided in the rotating body 16. The first heater 22 heats the wafer W held on the susceptor 14 from the lower side. The first heater 22 is, for example, a resistance heater. The first heater 22 has, for example, a disc shape where a comb pattern is applied.

The reflector 28 is provided below the first heater 22. The first heater 22 is provided between the reflector 28 and the susceptor 14.

The reflector 28 reflects the heat radiated downward from the first heater 22 to improve the heating efficiency of the wafer W. In addition, the reflector 28 prevents the members below the reflector 28 from being heated. The reflector 28 has, for example, a disc shape. The reflector 28 is made of a material having high heat resistance, for example, a carbon coated with SiC or the like.

The reflector 28 is fixed to the fixing base 32 by, for example a plurality of the support posts 30. The fixing base 32 is supported by, for example, the fixed shaft 34.

A push up pin (not illustrated) is provided in the rotating body 16 in order to detach the susceptor 14 from the rotating body 16. The push up pin penetrates, for example, the reflector 28 and the first heater 22.

The second heater 42 is provided between the hood 40 and the inner wall 10a of the reaction chamber 10. The second heater 42 heats the wafer W held on the susceptor 14 from the upper side. By heating the wafer W by the second heater 42 in addition to the first heater 22, it is possible to heat the wafer W at a temperature required for the growth of the SiC film, for example, a temperature of 1500° C. or more. The second heater 42 is, for example, a resistance heater.

The hood 40 is provided in the region between the process gas supply part 12 and the susceptor 14 in the reaction chamber 10. The hood 40 has, for example, a cylindrical shape. The hood 40 has a function of preventing the first process gas G1 and the second process gas G2 from being in contact with the second heater 42. The hood 40 is made of a material having high heat resistance, for example, a carbon coated with SiC or the like.

The gas outlet 44 is provided at the bottom of the reaction chamber 10. The gas outlet 44 discharges the surplus of the reaction product after the source gases reacts on the surface of the wafer W and the surplus of the process gases to the outside of the reaction chamber 10. The gas outlet 44 is connected to, for example, a vacuum pump (not illustrated).

In addition, a wafer doorway and a gate valve (not illustrated) are provided on the reaction chamber 10. By the wafer doorway and the gate valve, the wafer W can be loaded into the reaction chamber 10, or the wafer W can be unloaded to the outside of the reaction chamber 10.

Figure 3:
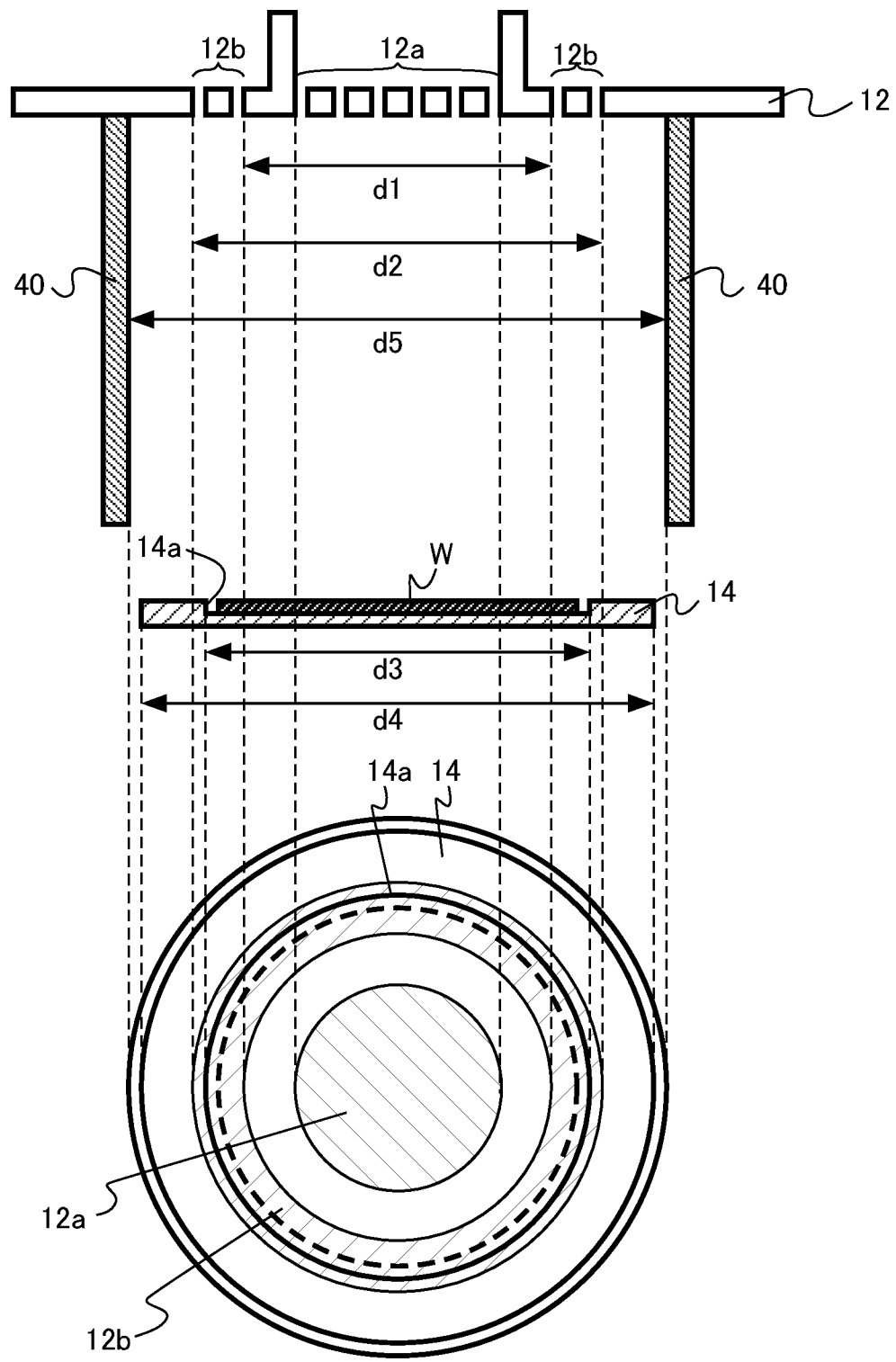
FIG. 3 is an explanatory diagram of dimensions of members of the vapor phase growth apparatus according to the first embodiment.

FIG. 3 is an explanatory diagram of dimensions of members of the vapor phase growth apparatus according to the first embodiment. FIG. 3 illustrates a portion of the process gas supply part 12, the hood 40, the susceptor 14, and the wafer W mounted on the susceptor 14.

In FIG. 3, the upper figure is a cross-sectional view, and the lower figure is a plan view. In the plan view, the first region 12a and the second region 12b are indicated by hatching. In the plan view, the wafer W is illustrated with a dotted line, and orientation flats or notches are omitted.

The inner peripheral diameter of the second region 12b is denoted by d1. The inner peripheral diameter of the second region 12b is defined by the diameter of a circle inscribed in ejection holes that are the innermost ones of the second gas ejection holes 58. The outer peripheral diameter of the second region 12b is denoted by d2. The outer peripheral diameter of the second region 12b is defined by the diameter of a circle circumscribing the ejection holes that are the outermost ones of the second gas ejection holes 58.

The diameter of the holding wall 14a of the susceptor 14 is denoted by d3. The diameter of the susceptor 14 is denoted by d4. In addition, the inner peripheral diameter of the hood 40 is denoted by d5.

The inner peripheral diameter d1 of the second region 12b is 75% or more and 130% or less of the diameter d3 of the holding wall 14a. The outer peripheral diameter d2 of the second region 12b is larger than, for example, the diameter d3 of the holding wall 14a.

The inner peripheral diameter d5 of the hood 40 is 110% or more and 200% or less of the outer peripheral diameter d2 of the second region 12b. In addition, it is preferable that the inner peripheral diameter d5 of the hood 40 is 105% or more and 200% or less of the diameter d4 of the susceptor 14.

Next, the vapor phase growth method according to the first embodiment will be described. The vapor phase growth method according to the first embodiment uses the epitaxial growth apparatus illustrated in FIG. 1. The case of forming a single crystal SiC film doped by using nitrogen as an n-type impurity on the surface of the wafer of a single crystal SiC is described as an example.

First, the susceptor 14 on which the wafer W is mounted is loaded into the reaction chamber 10. The wafer W is a single crystal SiC.

Next, the wafer W is rotated at a rotational speed of 300 rpm or more by the rotation driver 20. Then, the wafer W is heated by the first heater 22 and the second heater 42.

Next, the first process gas G1 is supplied at a first flow rate from the first region 12a of the process gas supply part 12 toward the central portion of the surface of the wafer W. The first process gas G1 ejected from the first gas ejection holes 56 becomes a laminar flow directed from the process gas supply part 12 toward the surface of the wafer W.

In addition, the second process gas G2 is supplied at a second flow rate from the second region 12b of the process gas supply part 12 toward a region on an outer side than the central portion of the wafer W. The second process gas G2 is supplied to a region on an outer side of the wafer W than the first process gas G1. The second process gas G2 ejected from the second gas ejection holes 58 becomes a laminar flow directed from the process gas supply part 12 toward the surface of the wafer W.

The first flow rate and the second flow rate are, for example, 0.2 m/sec or more and 1.0 m/sec or less.

The first process gas G1 is a mixed gas containing, for example, the source gas of silicon, the source gas of carbon, the dopant gas of n-type impurity, the assist gas, and the carrier gas. The source gas of silicon is, for example, silane ($SiH_4$). The source gas of carbon is, for example, propane ($C_3H_8$). The dopant gas of n-type impurity is, for example, a nitrogen gas. The assist gas is, for example, a hydrogen chloride (HCl) gas. The carrier gas is, for example, an argon gas or a hydrogen gas.

The second process gas G2 is a mixed gas containing, for example, the source gas of silicon, the source gas of carbon, the dopant gas of n-type impurity, and the carrier gas. The source gas of silicon is, for example, silane. The source gas of carbon is, for example, propane. The dopant gas of n-type impurity is, for example, a nitrogen gas. The carrier gas is, for example, an argon gas or a hydrogen gas.

The C/Si ratio of the second process gas G2 supplied from the process gas supply part 12 to the reaction chamber 10 is higher than the C/Si ratio of the first process gas G1.

By supplying the first process gas G1 and the second process gas G2 to the surface of the wafer W, a single crystal SiC film doped with nitrogen as an n-type impurity is formed on the surface of the wafer W. In forming the single crystal SiC film, by controlling the first flow rate of the first process gas G1, the second flow rate of the second process gas G2, and the rotational speed of the wafer W, a flow of the second process gas G2 to be pulled in the direction toward the center of the wafer W is formed.

The first flow rate can be controlled, for example, by changing the flow rate of the process gas supplied to the first gas ejection holes 56 by using a mass flow controller (not illustrated). In addition, the second flow rate can be controlled, for example, by changing the flow rate of the process gas supplied to the second gas ejection holes 58 by using a mass flow controller (not illustrated). The rotational speed of the wafer W can be controlled by the rotation driver 20.

Figure 4:
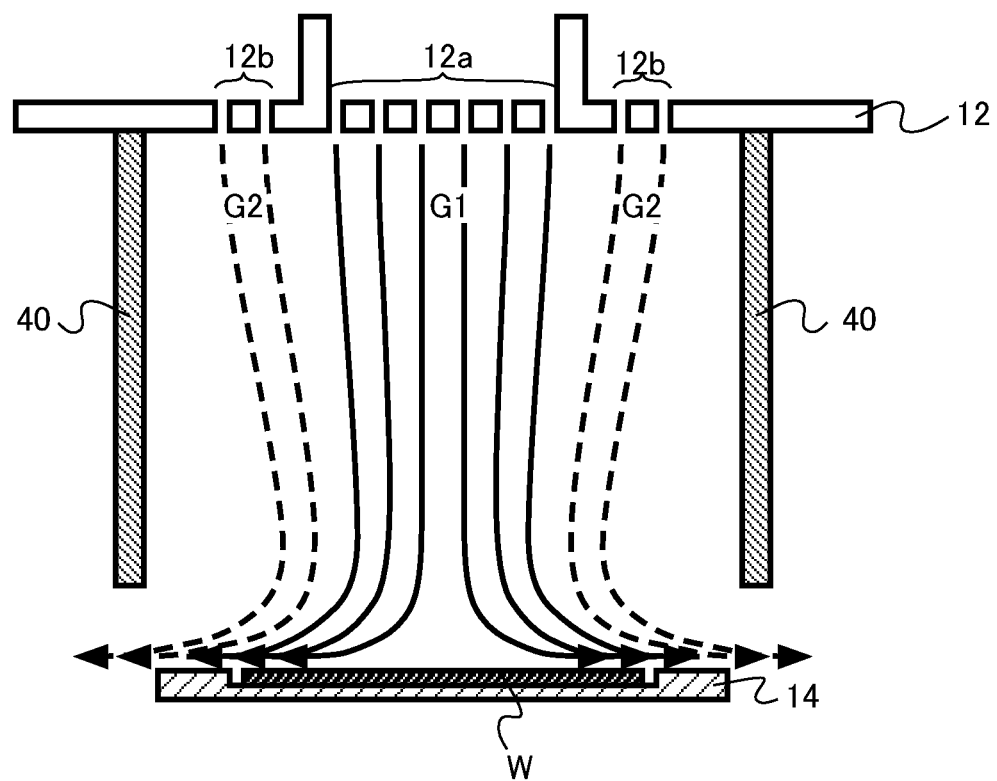
FIG. 4 is an explanatory diagram of flows of process gases in a reaction chamber in a vapor phase growth method according to the first embodiment.

FIG. 4 is a diagram illustrating a flow of a process gas in the reaction chamber in the vapor phase growth method according to the first embodiment. In forming the single crystal SiC film, the first process gas G1 as a laminar flow in the vertical direction ejected from the first region 12a becomes a horizontal flow directed toward the outside of the wafer W on the surface of the wafer W. The second process gas G2 as laminar flow in the vertical direction ejected from the second region 12b flows so as to be pulled in the direction toward the center of the wafer W, and after that, becomes a horizontal flow directed toward the outside of the wafer W on the surface of the wafer W. In other words, the direction of the flow of the second process gas G2 has a component directed in the direction toward the center of the wafer W before reaching the surface of the wafer W.

After the formation of the single crystal SiC film, the heating by the first heater 22 and the second heater 42 is stopped, so that the temperature of the wafer W is lowered. After that, the wafer W together with the susceptor 14 is unloaded from the reaction chamber 10.

Next, functions and effects of the vapor phase growth apparatus and the vapor phase growth method according to the first embodiment will be described.

Figure 5:
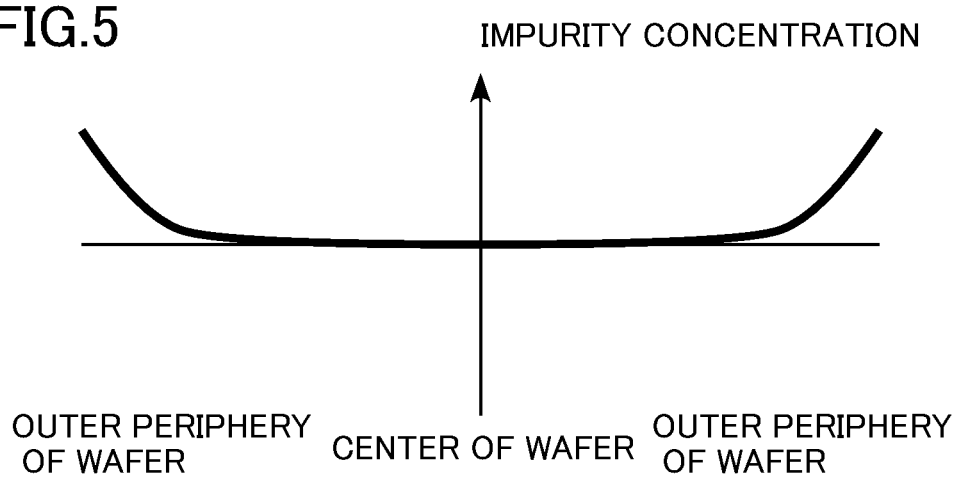
FIG. 5 is an explanatory diagram of problems in forming an SiC film.

FIG. 5 is an explanatory diagram of problems in forming the SiC film. FIG. 5 illustrates an in-plane distribution of the impurity concentration in forming the SiC film doped with nitrogen as an n-type impurity on the wafer.

As illustrated in FIG. 5, in the outer peripheral portion of the wafer W, the concentration of nitrogen in the SiC film is increased. For this reason, the concentration distribution of the n-type impurity in the SiC film becomes non-uniform, and the in-plane resistance distribution of the wafer W becomes non-uniform.

One reason why the concentration of nitrogen is increased in the outer peripheral portion of the wafer W is considered that silicon sublimed from deposits containing silicon deposited on the surface of the susceptor 14 in the outer side of the wafer W is mixed into the process gas in the outer peripheral portion of the wafer W. Since the sublimated silicon is mixed into the process gas in the outer peripheral portion of the wafer W, the C/Si ratio in the process gas supplied to the outer peripheral portion of the wafer W is lowered. Since the nitrogen enters into the carbon lattice positions in the SiC crystal, the nitrogen is incorporated into the crystal. For this reason, if the C/Si ratio in the process gas is lowered, the carbon is decreased, so that the nitrogen easily enters into the carbon lattice positions in the SiC crystal. Therefore, the concentration of nitrogen in the outer peripheral portion becomes higher than that in the central portion of the wafer W.

In the vapor phase growth apparatus and the vapor phase growth method according to the first embodiment, first, the second process gas G2 having a high C/Si ratio in the outer peripheral portion of the wafer W is supplied. Furthermore, by controlling the first flow rate of the first process gas G1 supplied to the central portion of the wafer W, the second flow rate of the second process gas G2 supplied to the outer peripheral portion of the wafer W, and the rotational speed of the wafer W, the uniformity of the concentration distribution of the n-type impurity in the SiC film is improved.

Figure 6A:
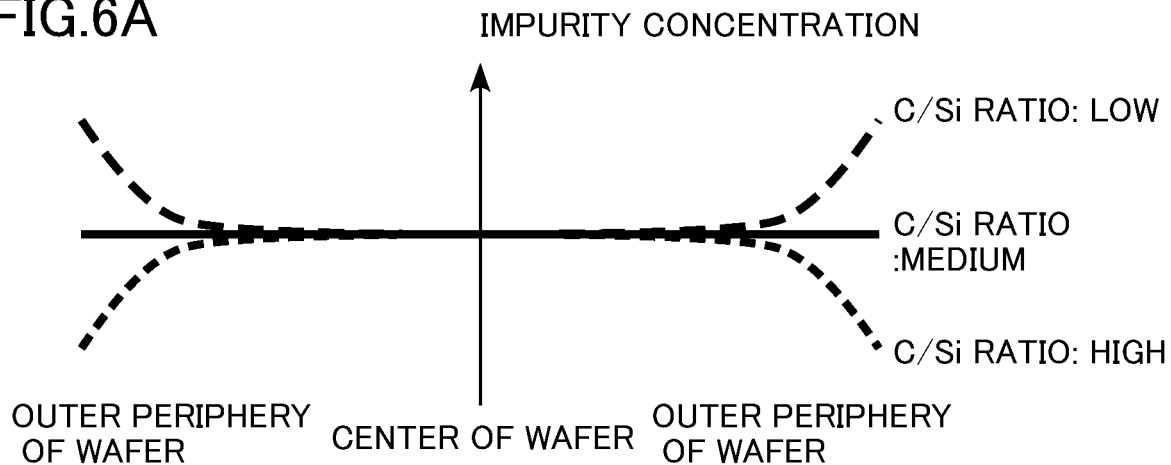
FIGS. 6A, 6B, 6C are diagrams illustrating a relationship between parameters and a distribution of an impurity concentration in a surface of a wafer in the vapor phase growth method according to the first embodiment.
Figure 6B:
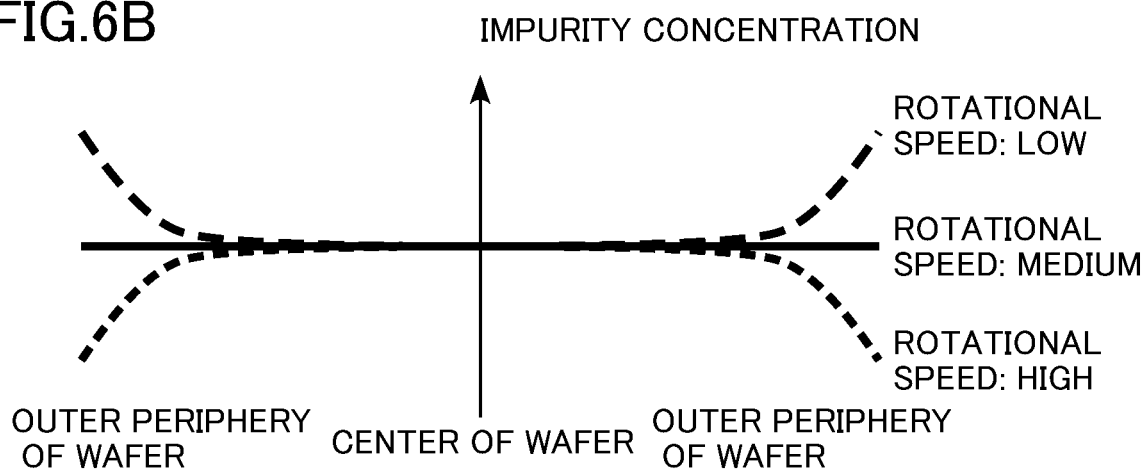
Figure 6C:
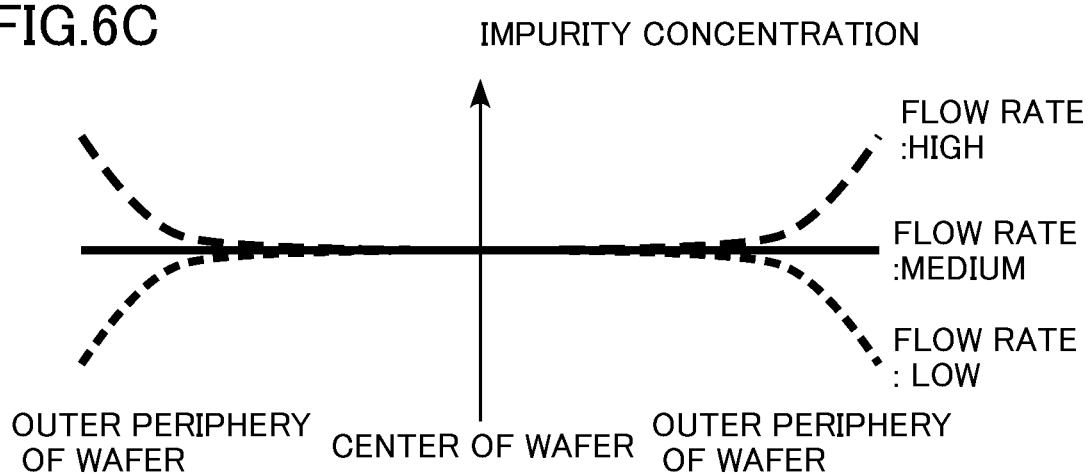

FIGS. 6A, 6B, 6C are diagrams illustrating a relationship between parameters and a distribution of an impurity concentration in a surface of the wafer in the vapor phase growth method according to the first embodiment. FIG. 6A illustrates a case where the parameter is the C/Si ratio of the second process gas G2, FIG. 6B illustrates a case where the parameter is the rotational speed of the wafer W, and FIG. 6C illustrates a case where the parameter is the second flow rate of the second process gas G2.

As illustrated in FIG. 6A, the concentration of nitrogen in the outer peripheral portion of the wafer W is decreased if the C/Si ratio of the second process gas G2 becomes high, and the concentration of nitrogen in the outer peripheral portion of the wafer W is increased if the C/Si ratio in the outer peripheral portion of the wafer W becomes low. It is considered that this is because, if the C/Si ratio of the second process gas G2 becomes high, the C/Si ratio in the outer peripheral portion of the wafer W becomes high, so that the nitrogen does not easily enter into the SiC crystal. In addition, it is considered that this is because if the C/Si ratio of the second process gas G2 becomes low, the C/Si ratio in the outer peripheral portion of the wafer W becomes low, so that the nitrogen easily enters into the SiC crystal.

In addition, as illustrated in FIG. 6B, the concentration of nitrogen in the outer peripheral portion of the wafer W is decreased if the rotational speed of the wafer W becomes high, and the concentration of nitrogen in the outer peripheral portion of the wafer W is increased if the rotational speed of the wafer W becomes low. It is considered that this is because a pull-in amount of the second process gas G2 in the direction toward the center of the wafer W is increased by making the rotational speed of the wafer W to be high. It is considered that, if the pull-in amount of the second process gas G2 having a high C/Si ratio is increased, the C/Si ratio in the outer peripheral portion of the wafer W becomes high, so that the nitrogen does not easily enter into the SiC crystal. On the contrary, it is considered that, by making the rotational speed of the wafer W to be low, the pull-in amount of the second process gas G2 having a high C/Si ratio is decreased, and since the C/Si ratio in the outer peripheral portion of the wafer W becomes low, so that the nitrogen easily enters into the SiC crystal.

In addition, as illustrated in FIG. 6C, the concentration of nitrogen in the outer peripheral portion of the wafer W is increased if the second flow rate of the second process gas G2 is made to be high, and the concentration of nitrogen in the outer peripheral portion of the wafer W is decreased if the second flow rate of the second process gas G2 is made to be low. It is considered that this is because, if the second flow rate of the second process gas G2 is made to be high, the pull-in amount of the second process gas G2 in the direction toward the center of the wafer W is decreased, so that nitrogen easily enters into the SiC crystal in the outer peripheral portion of the wafer W. On the contrary, it is considered that, if the second flow rate of the second process gas G2 is made to be low, the pull-in amount of the second process gas G2 in the direction toward the center of the wafer W is increased, so that nitrogen does not easily enter into the SiC crystal in the outer peripheral portion of the wafer W.

In the vapor phase growth apparatus 100 and the vapor phase growth method according to the first embodiment, the second process gas G2 having a carbon/silicon atomic ratio higher than that of the first process gas G1 is supplied to a region on an outer side than the first process gas G1. Then, by controlling the first flow rate of the first process gas G1, the second flow rate of the second process gas G2 supplied to the outer peripheral portion of the wafer W, and the rotational speed of the wafer W, a flow of the second process gas G2 pulled in the direction toward the center of the wafer W is formed, so that the SiC film is formed. Accordingly, the uniformity of the concentration distribution of the n-type impurity in the SiC film is improved.

In particular, by applying the adjustment of the concentration distribution by changing the second flow rate of the second process gas G2 and the rotational speed of the wafer W, it is possible to improve the uniformity of the concentration distribution of the impurity with higher accuracy than by performing the adjustment of the concentration distribution according to only the C/Si ratio of the second process gas G2.

From the viewpoint of implementing a flow of the second process gas G2 directed in the direction toward the center of the wafer W and implementing the concentration distribution of the impurity having a high uniformity, the inner peripheral diameter d1 of the second region 12b of the vapor phase growth apparatus 100 is required to be 75% or more and 130% or less of the diameter d3 of the holding wall 14a. If the inner peripheral diameter d1 of the second region 12b is below the above range, the impurity concentration of the central portion of the wafer W becomes low, and thus, there is a concern that the concentration distribution of the impurity becomes non-uniform. In addition, if the inner peripheral diameter d1 of the second region 12b exceeds the above range, the pull-in amount of the second process gas G2 is insufficient, and thus, there is a concern that the concentration distribution of the impurity becomes non-uniform.

From the viewpoint of suppressing the lowering of the impurity concentration of the central portion of the wafer W, it is preferable that the inner peripheral diameter d1 of the second region 12b is 100% or more of the diameter d3 of the holding wall 14a. On the other hand, from the viewpoint of suppressing insufficiency of the pull-in amount of the second process gas G2, it is preferable that the inner peripheral diameter d1 of the second region 12b is less than 100% of the diameter d3 of the holding wall 14a.

In the vapor phase growth apparatus 100 according to the first embodiment, from the viewpoint of implementing a flow of the second process gas G2 directed in the direction toward the center of the wafer W and implementing the concentration distribution of the impurity having a high uniformity, the inner peripheral diameter d5 of the hood 40 is required to be 110% or more and 200% or less of the outer peripheral diameter d2 of the second region 12b, preferably, 110% or more and 150% or less of the outer peripheral diameter d2 of the second region 12b. If the inner peripheral diameter d5 of the hood 40 is below the above range, there is a concern that a laminar flow of the second process gas G2 directed in the vertical direction is disturbed by the influence of the hood 40. In addition, if the inner peripheral diameter d5 of the hood 40 exceeds the above range, the second process gas G2 flows toward the hood 40 side, and thus, it is difficult to implement a flow of the second process gas G2 directed in the direction toward the center of the wafer W.

In addition, from the viewpoint of implementing the flow of the second process gas G2 directed in the direction toward the center of the wafer W and implementing the concentration distribution of the impurity having a high uniformity, it is preferable that the inner peripheral diameter d5 of the hood 40 is 105% or more and 200% or less of the diameter d4 of the susceptor 14.

In the vapor phase growth method according to the first embodiment, it is necessary to set the rotational speed of the wafer W to 300 rpm or more. When the rotational speed is less than 300 rpm, there is a concern that the pull-in amount of the second process gas G2 in the direction toward the center of the wafer W becomes insufficient.

In addition, the first flow rate and the second flow rate are preferably 0.2 m/sec or more and 1.0 m/sec or less, more preferably, 0.2 m/sec or more and 0.5 m/sec or less. If the first flow rate and the second flow rate are below the above range, the first process gas G1 and the second process gas G2 are easily mixed, so that the functions of the first embodiment cannot be expressed. In addition, if the first flow rate and the second flow rate exceed the above range, the flow of the second process gas G2 in the vertical direction becomes too fast, there is a concern that the pull-in amount of the second process gas G2 in the direction toward the center of the wafer W becomes insufficient.

From the viewpoint of controlling the pull-in amount of the second process gas G2 in the direction toward the center of the wafer W, it is preferable that the second flow rate of the second process gas G2 is 50% or more and 200% or less of the first flow rate of the first process gas G1. From the viewpoint of increasing the pull-in amount of the second process gas G2 in the direction toward the center of the wafer W, it is preferable that the second flow rate of the second process gas G2 is made to be lower than the first flow rate of the first process gas G1. In addition, from the viewpoint of suppressing the pull-in amount of the second process gas G2 in the direction toward the center of the wafer W, it is preferable that the second flow rate of the second process gas G2 is made to be higher than the first flow rate of the first process gas G1.

In addition, in the vapor phase growth apparatus and the vapor phase growth method according to the first embodiment, even in the case of changing the diameter of the wafer W, it is also possible to improve the uniformity of the concentration distribution of the n-type impurity in the SiC film. For example, in the case of making the diameter of the wafer W to be small, it is difficult to increase the C/Si ratio in the outer peripheral portion of the wafer W by making the inner peripheral diameter d1 of the second region 12b of the process gas supply part 12 to be small since the increasing of the C/Si ratio in the outer peripheral portion of the wafer W requires design change or replacement of the process gas supply part 12.

Figure 7:
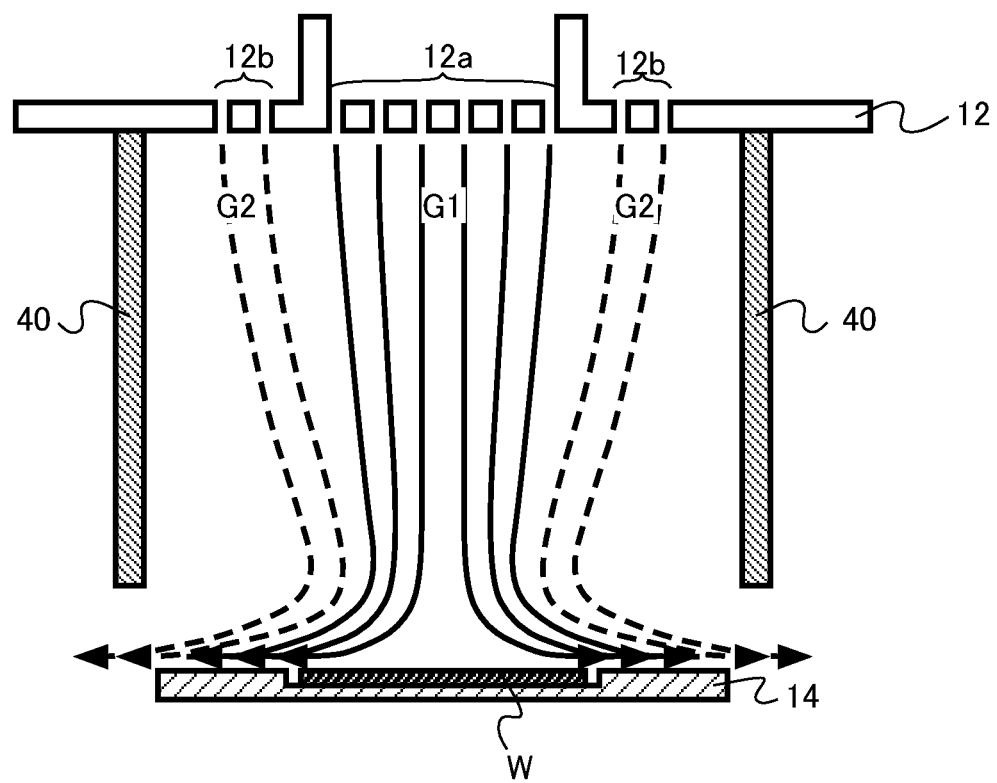
FIG. 7 is an explanatory diagram of the flows of the process gases in the reaction chamber in the vapor phase growth method according to the first embodiment.

FIG. 7 is a diagram illustrating flows of the process gases in the reaction chamber in the vapor phase growth method according to the first embodiment. FIG. 7 illustrates the case of forming films on the wafer W of which diameter becomes about ⅔ of the diameter of the wafer W in FIG. 4.

As illustrated in FIG. 7, by increase the rotational speed of the wafer W or by decreasing the second flow rate of the second process gas G2, it is possible to increase the pull-in amount of the second process gas G2 in the direction toward the center of the wafer W. Therefore, even in a case where the diameter of the wafer W is changed, it is easy to improve the uniformity of the concentration distribution of the n-type impurity in the SiC film.

Heretofore, according to the vapor phase growth apparatus and the vapor phase growth method according to the first embodiment, the uniformity of the concentration distribution of the n-type impurity in the SiC film is improved.

Second Embodiment

A vapor phase growth apparatus according to a second embodiment is the same as that according to the first embodiment except that the process gas supply part further has a third region and gas passage holes are provided to the sidewall. Therefore, a portion of the contents overlapped with the first embodiment will be omitted in description.

Figure 8:
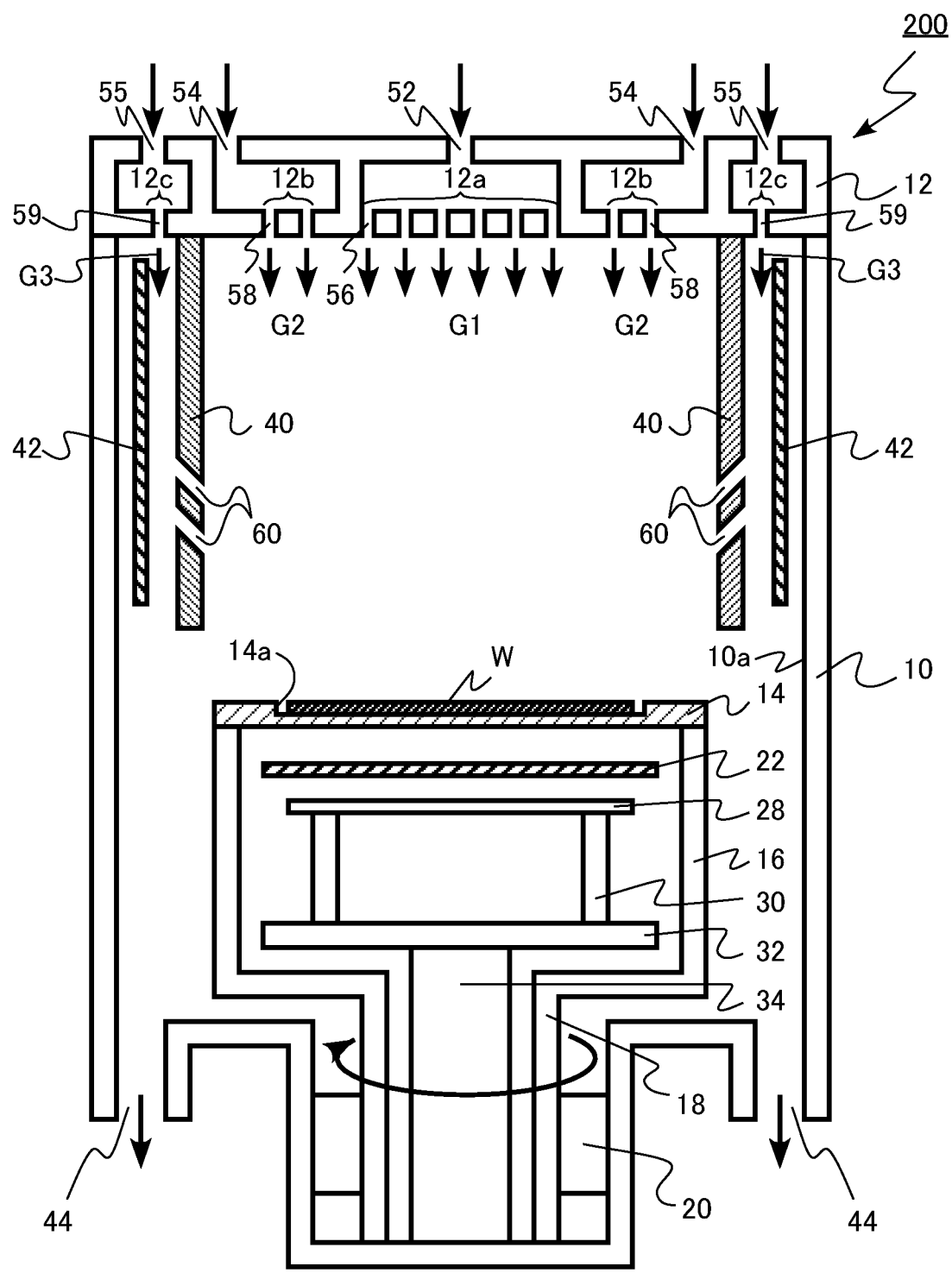
FIG. 8 is a schematic cross-sectional view of a vapor phase growth apparatus according to a second embodiment.

FIG. 8 is a schematic cross-sectional view of the vapor phase growth apparatus according to the second embodiment. The vapor phase growth apparatus according to the second embodiment is, for example, a single wafer type epitaxial growth apparatus epitaxially growing a single crystal SiC film on a single crystal SiC substrate.

A vapor phase growth apparatus 200 according to the second embodiment includes a reaction chamber 10 and a process gas supply part 12. The reaction chamber 10 includes a susceptor 14 (substrate holder), a rotating body 16, a rotation shaft 18, a rotation driver 20, a first heater 22, a reflector 28, a support posts 30, a fixing base 32, a fixed shaft 34, a hood 40 (sidewall), a second heater 42, and a gas outlet 44. The process gas supply part 12 includes a first gas supply port 52, a second gas supply port 54, a third gas supply port 55, first gas ejection holes 56, second gas ejection holes 58, and third gas ejection holes 59. A region in which the first gas ejection holes 56 of the process gas supply part 12 are provided is a first region 12a, a region in which the second gas ejection holes 58 are provided is a second region 12b, and a region in which the third gas ejection holes 59 are provided is a third region 12c.

The first gas supply port 52, the second gas supply port 54, and, the third gas supply port 55 are provided in the upper portion of the process gas supply part 12. The first gas supply port 52 supplies, for example, a first process gas G1 into the process gas supply part 12. The second gas supply port 54 supplies, for example, a second process gas G2 into the process gas supply part 12. The third gas supply port 55 supplies, for example, a third process gas G3 into the process gas supply part 12.

The first gas ejection holes 56, the second gas ejection holes 58, and the third gas ejection holes 59 are provided in the lower portion of the process gas supply part 12. The first gas ejection holes 56, the second gas ejection holes 58, and the third gas ejection holes 59 are provided to face the reaction chamber 10.

The second gas ejection holes 58 are provided around the first gas ejection holes 56. The third gas ejection holes 59 are provided around the second gas ejection holes 58. The region in which the first gas ejection holes 56 of the process gas supply part 12 are provided is the first region 12a, the region in which the second gas ejection holes 58 are provided is the second region 12b, and the region in which the third gas ejection holes 59 are provided is the third region 12c.

The third gas ejection holes 59 supplies the third process gas G3 to the region between the hood 40 and the second heater 42. The third process gas G3 is, for example, an argon gas.

The hood 40 has gas passage holes 60. The gas passage holes 60 are provided so as to enable the third process gas G3 to pass from the second heater 42 side to the wafer W side.

Figure 9:
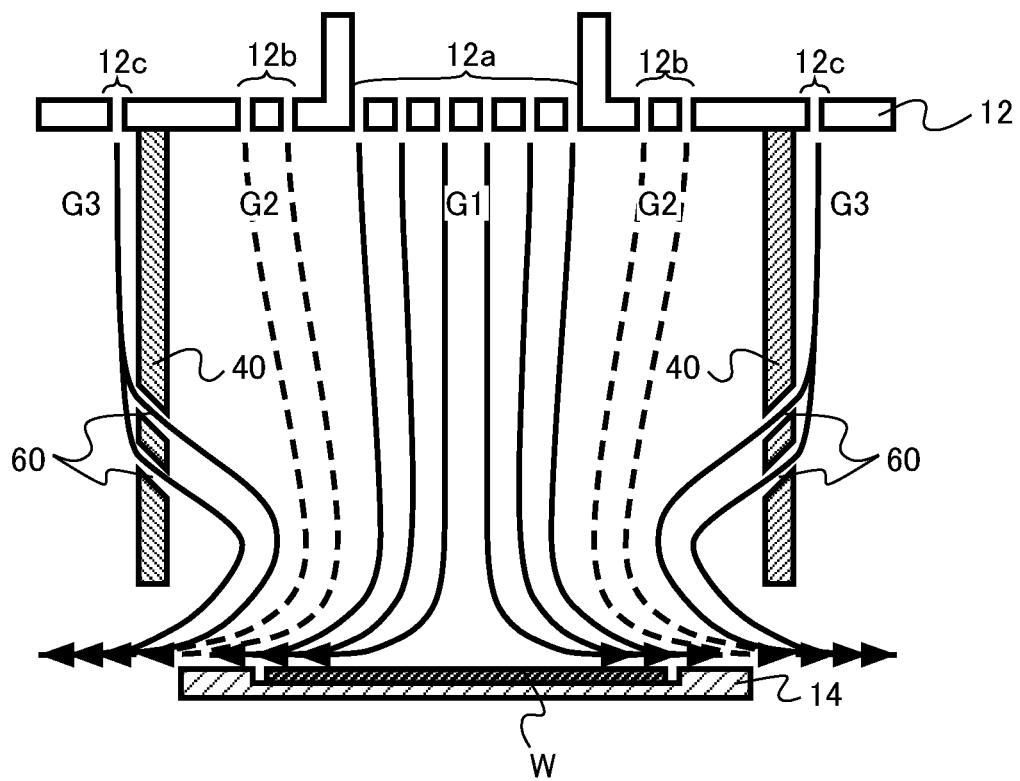
FIG. 9 is an explanatory diagram of flows of process gases in a reaction chamber in a vapor phase growth method according to the second embodiment.

FIG. 9 is an explanatory diagram of flows of the process gases in the reaction chamber in the vapor phase growth method according to the second embodiment. As illustrated in FIG. 9, the third process gas G3 passes through the gas passage holes 60 and flows to the wafer W side. Then, due to the flow of the third process gas G3, the flow of the second process gas can be pushed in the direction toward the center of the wafer W. As a result, the pull-in amount of the second process gas G2 in the direction toward the center of the wafer W is increased.

According to the vapor phase growth apparatus and the vapor phase growth method according to the second embodiment, the pull-in amount of the second process gas G2 in the direction toward the center of the wafer W can be adjusted by the third process gas G3. Therefore, the uniformity of the concentration distribution of the n-type impurity in the SiC film is further improved.

Third Embodiment

A vapor phase growth method according to a third embodiment includes: rotating a substrate at a rotational speed of 300 rpm or more; heating the substrate; supplying a first process gas containing carbon, silicon, and an n-type impurity toward the substrate; supplying a second process gas containing carbon and an n-type impurity and having a carbon/silicon atomic ratio of the second process gas higher than that of the first process gas toward the substrate in a region on an outer side than a region being supplied with the first process gas; forming a first silicon carbide film on a surface of the substrate in a state of an effective carbon/silicon atomic ratio of the process gas just above the surface of the substrate being less than 1; supplying a third process gas containing carbon, silicon, and an n-type impurity toward the substrate; supplying a fourth process gas containing carbon and an n-type impurity and having a carbon/silicon atomic ratio higher than that of the third process gas toward the substrate in a region on an outer side than a region being supplied with the third process gas; and forming a second silicon carbide film having an n-type impurity concentration lower than that of the first silicon carbide film on the surface of the substrate in a state of the effective carbon/silicon atomic ratio of the process gas just above the surface of the substrate being 1 or more.

The vapor phase growth method according to the third embodiment is different from the vapor phase growth method according to the first embodiment in that the first silicon carbide film and the second silicon carbide film having the different n-type impurity concentration are formed on the substrate. Hereinafter, a portion of the contents overlapped with the vapor phase growth apparatus and the vapor phase growth method according to the first embodiment will be omitted in description.

The vapor phase growth method according to the third embodiment utilizes the epitaxial growth apparatus illustrated in FIG. 1. In addition, the vapor phase growth method according to the third embodiment utilizes the epitaxial growth apparatus having the process gas supply part illustrated in FIG. 2. Hereinafter, the case where the n-type impurity is nitrogen will be described as an example.

Figure 10:
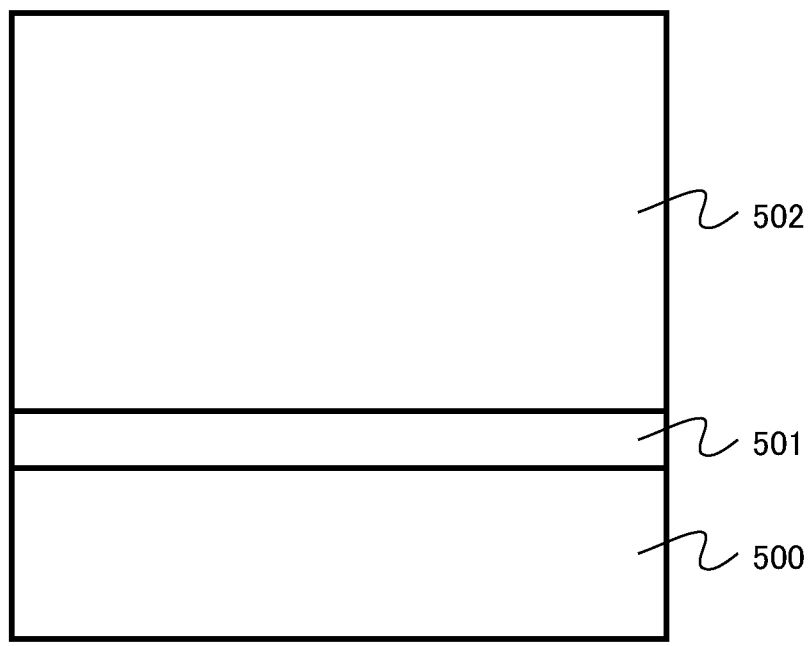
FIG. 10 is a cross-sectional view of a silicon carbide film formed in a vapor phase growth method according to a third embodiment.

FIG. 10 is a cross-sectional view of a silicon carbide film formed by the vapor phase growth method according to the third embodiment. A buffer film 501 (first silicon carbide film) and an n-type film 502 (second silicon carbide film) are formed on the substrate 500.

The substrate 500 is a wafer of single crystal SiC. The substrate 500 contains nitrogen as an n-type impurity. The nitrogen concentration of the substrate 500 is, for example, $1 \times 10^{17}$ cm$^{-3}$ or more and $1 \times 10^{19}$ cm$^{-3}$ or less.

The buffer film 501 is a single crystal SiC film. The buffer film 501 has a function of suppressing a propagation of basal plane dislocations (BPD) contained in the substrate 500 to the n-type film 502. During the growth of the buffer film 501, for example, the basal plane dislocations are converted to other dislocations.

The buffer film 501 contains nitrogen as an n-type impurity. The nitrogen concentration of the buffer film 501 is, for example, $1 \times 10^{-17}$ cm$^{-3}$ or more and $1 \times 10^{19}$ cm$^{-3}$ or less. The thickness of the buffer film 501 is, for example, 0.5 μm or more and 2 μm or less.

From the viewpoint of suppressing the propagation of the basal plane dislocations to the n-type film 502, it is preferable that the nitrogen concentration of the buffer film 501 is $1 \times 10^{17}$ cm$^{-3}$ or more.

The n-type film 502 is a single crystal SiC film. The n-type film 502 contains nitrogen as an n-type impurity. The nitrogen concentration of the n-type film 502 is, for example, $1\times10^{14}$ cm$^{-3}$ or more and $1\times10^{16}$ cm$^{-3}$ or less. The nitrogen concentration of the n-type film 502 is lower than the nitrogen concentration of the buffer film 501. The thickness of the n-type film 502 is, for example, 10 μm or more and 300 μm or less.

The n-type film 502 is used, for example, as a drift layer of a high breakdown voltage device such as a transistor and a diode. From the viewpoint of lengthening the lifetime of minority carriers, it is preferable that the amount of carbon vacancies acting as lifetime killers is reduced in the n-type film 502.

From the viewpoint of implementing a high breakdown voltage in a transistor and a diode, it is preferable that the nitrogen concentration of the n-type film 502 is $1\times10^{16}$ cm$^{-3}$ or less.

First, the susceptor 14 on which the wafer W is mounted is loaded into the reaction chamber 10. The wafer W is a single crystal SiC.

Next, the wafer W is rotated at a rotational speed of 300 rpm or more by the rotation driver 20. Then, the wafer W is heated by the first heater 22 and the second heater 42.

Next, the first process gas G1 is supplied from the first region 12a of the process gas supply part 12 toward the central portion of the surface of the wafer W. The first process gas G1 ejected from the first gas ejection holes 56 becomes a laminar flow directed from the process gas supply part 12 toward the surface of the wafer W. The first process gas contains carbon, silicon, and nitrogen.

In addition, the second process gas G2 is supplied from the second region 12b of the process gas supply part 12 toward a region on the outer side than the central portion of the wafer W. The second process gas G2 is supplied to a region on the outer side of the wafer W than the first process gas G1. The second process gas G2 ejected from the second gas ejection holes 58 becomes a laminar flow directed from the process gas supply part 12 toward the surface of the wafer W. The second process gas contains carbon and nitrogen.

The first process gas G1 is a mixed gas containing, for example, the source gas of silicon, the source gas of carbon, the dopant gas of n-type impurity, the assist gas, and the carrier gas. The source gas of silicon is, for example, silane (SiH$_4$). The source gas of carbon is, for example, propane (C$_3$H$_8$). The dopant gas of n-type impurity is a nitrogen gas. The assist gas is, for example, a hydrogen chloride (HCl) gas. The carrier gas is, for example, an argon gas or a hydrogen gas.

The second process gas G2 is a mixed gas containing, for example, the source gas of silicon, the source gas of carbon, the dopant gas of n-type impurity, and the carrier gas. The source gas of silicon is, for example, silane. The source gas of carbon is, for example, propane. The dopant gas of n-type impurity is a nitrogen gas. The carrier gas is, for example, an argon gas or a hydrogen gas.

The C/Si ratio of the second process gas G2 supplied from the process gas supply part 12 to the reaction chamber 10 is higher than the C/Si ratio of the first process gas G1.

By supplying the first process gas G1 and the second process gas G2 to the surface of the wafer W, the buffer film 501 containing the nitrogen as an n-type impurity is formed on the surface of the wafer W. The nitrogen concentration of the buffer film 501 is, for example, $1\times10^{17}$ cm$^{-3}$ or more. The thickness of the buffer film 501 is, for example, 0.5 μm or more and 2 μm or less.

The buffer film 501 is formed in a state where the effective carbon/silicon atomic ratio of the process gas just above the surface of the wafer W is less than 1. For example, in forming the buffer film 501, the effective carbon/silicon atomic ratio just above the surface of the wafer W in the regions of the central portion of the wafer W and the outer peripheral portion of the wafer W is made to be less than 1. Hereinafter, the effective carbon/silicon atomic ratio is referred to as the "effective C/Si ratio".

In addition, the central portion of the wafer denotes, for example, a region within 5 mm from the center of the wafer W. In addition, the outer peripheral portion of the wafer denotes, for example, a region within 5 mm inside from the outer peripheral edge of the wafer W.

Figure 11:
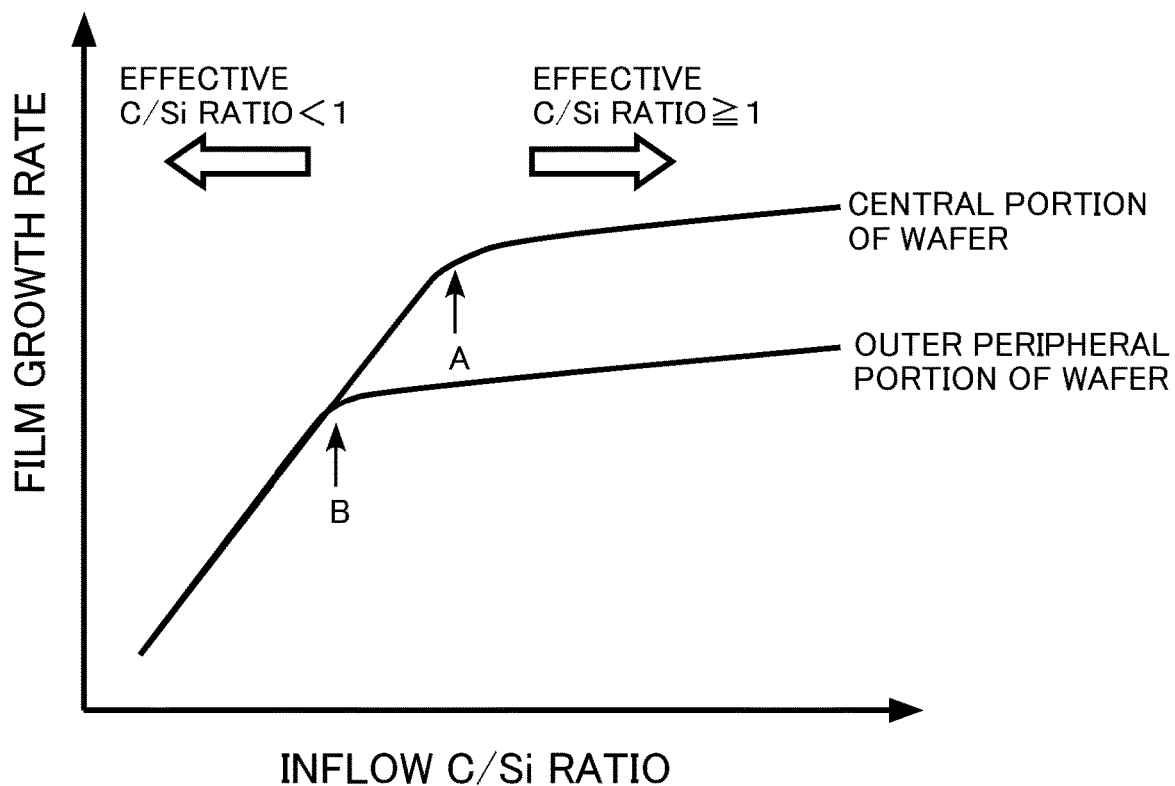
FIG. 11 is an explanatory diagram of the vapor phase growth method according to the third embodiment.

FIG. 11 is an explanatory diagram of a vapor phase growth method according to the third embodiment. FIG. 11 is an explanatory diagram illustrating a relationship between an inflow C/Si ratio and a film growth rate of the SiC film on the substrate.

Herein, the "inflow C/Si ratio" is a carbon/silicon atomic ratio of the process gas flow into the process supply unit illustrated in FIG. 2. More specifically, the inflow C/Si ratio is a carbon/silicon atomic ratio of the silicon in the source gas of silicon to be introduced into the source gas supply port 82 and the carbon in the source gas of carbon to be introduced into the source gas supply port 84.

FIG. 11 illustrates a case where the inflow C/Si ratio is changed by fixing the amount of silicon in the source gas of silicon to be introduced into the source gas supply port 82 and changing the amount of carbon in the source gas of carbon to be introduced into the source gas supply port 84.

If the inflow C/Si ratio increases and exceeds a predetermined value, the film growth rate is saturated. The point at which the film growth rate is saturated is referred to as a saturation point. The saturation of the film growth rate occurs at the point where the effective C/Si ratio of the process gas just above the surface of the substrate becomes 1. In other words, the saturation of the film growth rate occurs at the point where carbon:silicon=1:1. Since the C/Si ratio in the SiC film is 1, if the effective C/Si ratio of the process gas just above the surface of the substrate becomes 1 or more, the film growth rate is saturated.

A saturation point A of the central portion of the wafer is a position of the arrow A in FIG. 11. A saturation point B of the outer peripheral portion of the wafer is a position of the arrow B in FIG. 11. In the vapor phase growth apparatus according to the third embodiment, since the process gas is controlled so as the C/Si ratio increases toward the outer peripheral portion of the wafer with respect to the central portion of the wafer, the inflow C/Si ratio of the saturation point B of the outer peripheral portion of the wafer is lower than that of the saturation point A of the central portion of the wafer.

In the central portion of the wafer, the effective C/Si ratio becomes 1 or more at the inflow C/Si ratio of the saturation point A or more, and the effective C/Si ratio becomes less than 1 at the inflow C/Si ratio of less than the saturation point A. In addition, in the outer peripheral portion of the wafer, the effective C/Si ratio becomes 1 or more at the inflow C/Si ratio of the saturation point B or more, and the effective C/Si ratio becomes less than 1 at the inflow C/Si ratio of less than the saturation point B.

If the effective C/Si ratio tends to be 1 or more in both the central portion of the wafer and the outer peripheral portion of the wafer, the inflow C/Si ratio of the saturation point A or more is required. On the other hand, if the effective C/Si ratio tends to be less than 1 in both the central portion of the wafer and the outer peripheral portion of the wafer, the inflow C/Si ratio of less than the saturation point B is required.

By setting an appropriate inflow C/Si ratio, the desired effective C/Si ratio at the desired position of the surface of the wafer W can be implemented.

After the buffer film 501 is formed, the third process gas is supplied from the first region 12a of the process gas supply part 12 toward the central portion of the surface of the wafer W. The third process gas ejected from the first gas ejection holes 56 becomes a laminar flow directed from the process gas supply part 12 toward the surface of the wafer W. The third process gas contains carbon, silicon, and nitrogen.

In addition, the fourth process gas is supplied from the second region 12b of the process gas supply part 12 toward a region on the outer side than the central portion of the wafer W. The fourth process gas is supplied to a region on the outer side of the wafer W than the third process gas. The fourth process gas ejected from the second gas ejection holes 58 becomes a laminar flow directed from the process gas supply part 12 toward the surface of the wafer W. The fourth process gas contains carbon and nitrogen.

The third process gas is a mixed gas containing, for example, the source gas of silicon, the source gas of carbon, the dopant gas of n-type impurity, the assist gas, and the carrier gas. The source gas of silicon is, for example, silane. The source gas of carbon is, for example, propane. The dopant gas of n-type impurity is a nitrogen gas. The assist gas is, for example, a hydrogen chloride gas. The carrier gas is, for example, an argon gas or a hydrogen gas.

The fourth process gas is a mixed gas containing, for example, the source gas of silicon, the source gas of carbon, the dopant gas of n-type impurity, and the carrier gas. The source gas of silicon is, for example, silane. The source gas of carbon is, for example, propane. The dopant gas of n-type impurity is a nitrogen gas. The carrier gas is, for example, an argon gas or a hydrogen gas.

The C/Si ratio of the fourth process gas supplied from the process gas supply part 12 to the reaction chamber 10 is higher than the C/Si ratio of the third process gas.

By supplying the third process gas and the fourth process gas to the surface of the wafer W, an n-type film 502 containing nitrogen is formed on the surface of the wafer W. The nitrogen concentration of the n-type film 502 is, for example, $1 \times 10^{16}$ cm$^{-3}$ or less. The thickness of the n-type film 502 is, for example, 10 μm or more and 300 μm or less.

The n-type film 502 is formed in a state where the effective carbon/silicon atomic ratio of the process gas just above the surface of the wafer W, that is, the effective C/Si ratio is 1 or more. In forming the n-type film 502, the effective C/Si ratio of the region of the process gas just above the surface of the wafer W at the center of the wafer W and within 5 mm inside from the outer periphery of the wafer W is made to be 1 or more. The inflow C/Si ratio is set so that the effective C/Si ratio becomes 1 or more.

After the formation of the buffer film 501 and the n-type film 502, the heating by the first heater 22 and the second heater 42 is stopped, so that the temperature of the wafer W is lowered. After that, the wafer W together with the susceptor 14 is unloaded from the reaction chamber 10.

Next, functions and effects of the vapor phase growth method according to the third embodiment will be described.

Figure 12:
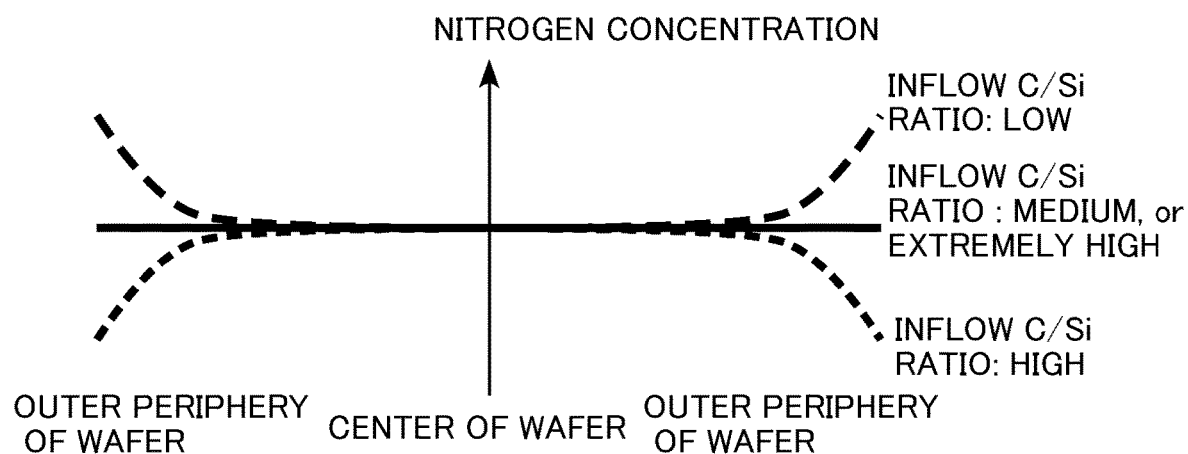
FIG. 12 is an explanatory diagram of functions and effects of the vapor phase growth method according to the third embodiment.

FIG. 12 is an explanatory diagram of the functions and effects of the vapor phase growth method according to the third embodiment. FIG. 12 is a diagram illustrating a relationship between the inflow C/Si ratio and a profile of the nitrogen concentration distribution in the surface of the wafer W. In addition, FIG. 12 is a diagram qualitatively illustrating the only change in profile of the nitrogen concentration distribution among the conditions and is not intended to illustrate a change in level of the nitrogen concentration among the conditions.

As illustrated in FIG. 12, in the state (low inflow C/Si ratio) where the inflow C/Si ratio is low, the nitrogen concentration in the outer peripheral portion of the wafer W is higher than the nitrogen concentration in the central portion of the wafer W; and if the inflow C/Si ratio is increased from the low inflow C/Si ratio to a medium state (medium inflow C/Si ratio), the nitrogen concentration in the outer peripheral portion of the wafer W is decreased, so that the nitrogen concentration distribution in the SiC film becomes uniform. In addition, if the inflow C/Si ratio is increased to a high state (high inflow C/Si), the nitrogen concentration in the outer peripheral portion of the wafer W is further decreased, the uniformity of the nitrogen concentration distribution in the SiC film is lowered. Then, if the inflow C/Si ratio is further increased to an extremely high state (extremely high inflow C/Si ratio), the nitrogen concentration distribution becomes uniform again.

While the inflow C/Si ratio is changed from the low inflow C/Si ratio to the medium inflow C/Si ratio, the effective C/Si ratio on the surface of the wafer W is sufficiently lower than 1. In addition, in the high inflow C/Si ratio, the effective C/Si ratio in the central portion of the wafer W is sufficiently lower than 1, and the effective C/Si ratio in the outer peripheral portion of the wafer W is close to 1. Furthermore, in the extremely high inflow C/Si ratio, the effective C/Si ratio in the surface of the wafer W is sufficiently higher than 1. In the region where the effective C/Si ratio is lower than 1, the reduction ratio of the nitrogen concentration in the SiC film accompanied with the increase in the effective C/Si ratio becomes large, and in the region where the effective C/Si ratio is higher than 1, the reduction ratio of the nitrogen concentration in the SiC film accompanied with the increase in the effective C/Si ratio becomes small. That is, if the inflow C/Si ratio is increased from the low inflow C/Si ratio to the high inflow C/Si ratio, the difference between the effective C/Si ratio in the outer peripheral portion of the wafer W and the effective C/Si ratio in the central portion of the wafer W becomes large, and the reduction ratio of the nitrogen concentration in the SiC film accompanied with the increase in the effective C/Si ratio is large, so that the nitrogen concentration in the outer peripheral portion of the wafer W becomes easier to reduce than the nitrogen concentration in the central portion of the wafer W. On the other hand, if the inflow C/Si ratio is increased from the high inflow C/Si ratio to the extremely high inflow C/Si ratio, the effective C/Si ratio exceeds 1 by only slightly increasing the inflow C/Si ratio in the outer peripheral portion of the wafer W, and thus, the reduction ratio of the nitrogen concentration in the SiC film is lowered. However, since the effective C/Si ratio does not exceed 1 unless the inflow C/Si ratio in the central portion of the wafer W is significantly increased, the nitrogen concentration in the central portion of the wafer W becomes easier to reduce than the nitrogen concentration in the outer peripheral portion of the wafer W. For this reason, a change in the shape of the nitrogen concentration distribution of the SiC film occurs as illustrated in FIG. 12.

Figure 13:
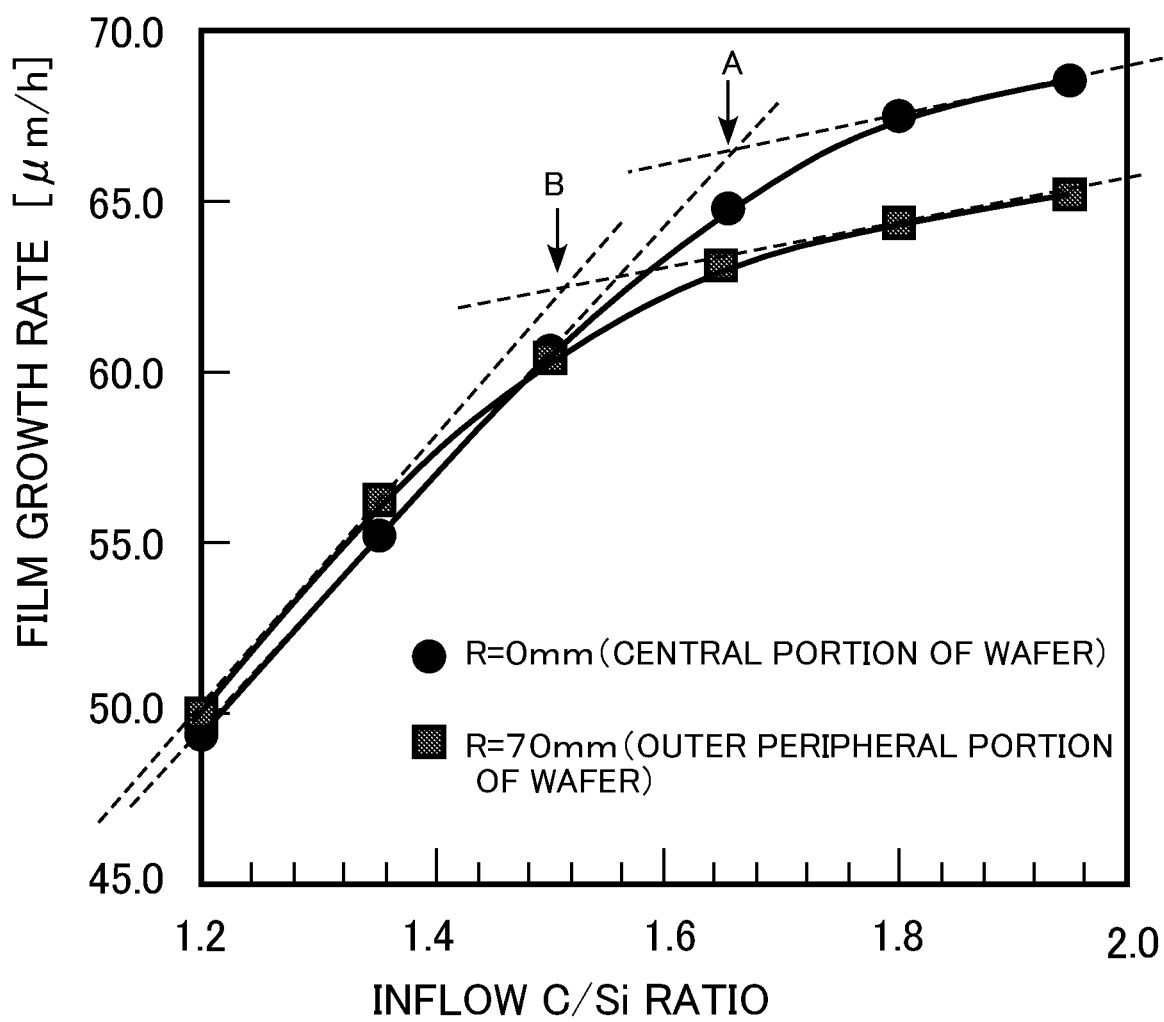
FIG. 13 is an explanatory diagram of the functions and effects of the vapor phase growth method according to the third embodiment.

FIG. 13 is an explanatory diagram of the functions and effects of the vapor phase growth method according to the third embodiment. The figure illustrates the measured value of the relationship between the inflow C/Si ratio and the film growth rate. The saturation point A of the central portion of the wafer is a position where the inflow C/Si ratio is about 1.65. The saturation point B of the outer peripheral portion of the wafer is a position where the inflow C/Si ratio is about 1.5.

If the effective C/Si ratio tends to be 1 or more in both the central portion of the wafer and the outer peripheral portion of the wafer, the inflow C/Si ratio of the saturation point A or more, that is, the inflow C/Si ratio of 1.65 or more is required. On the other hand, if the effective C/Si ratio tends to be less than 1 in both the central portion of the wafer and the outer peripheral portion of the wafer, the inflow C/Si ratio of less than the saturation point B, that is, the inflow C/Si ratio of less than 1.5 is required.

Figure 14:
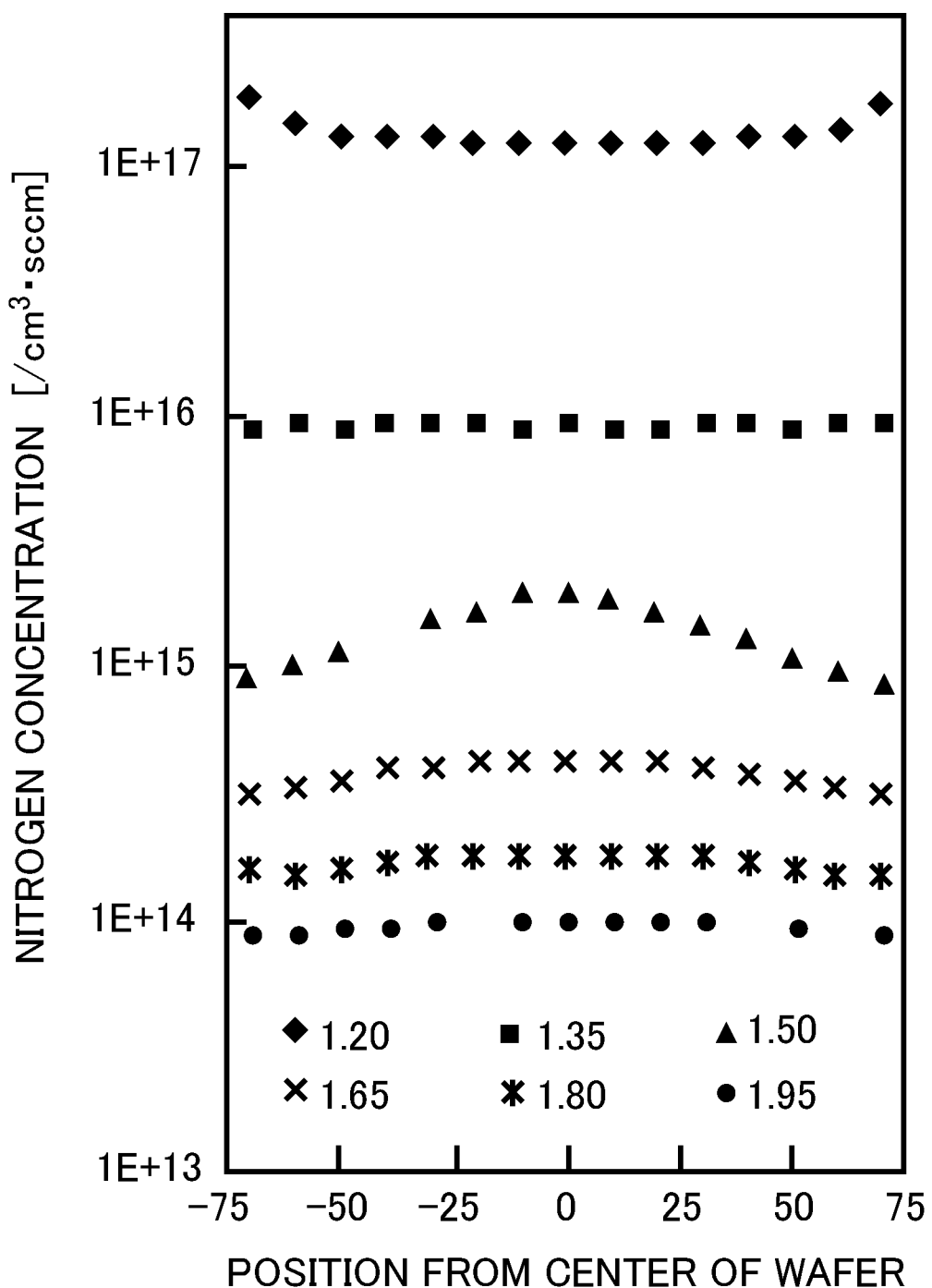
FIG. 14 is an explanatory diagram of the functions and effects of the vapor phase growth method according to the third embodiment.

FIG. 14 is an explanatory diagram of the functions and effects of the vapor phase growth method according to the third embodiment. FIG. 14 illustrates the nitrogen concentration distribution in the surface of the wafer W by using the inflow C/Si ratio as a parameter in the same process conditions as FIG. 13. The inflow C/Si ratio is made to be changed between 1.20 and 1.95. FIG. 14 is a measurement result using the wafer W having a diameter of 150 mm.

As apparent from FIG. 14, the distribution of the nitrogen concentration in the surface of the wafer W becomes uniform at the inflow C/Si ratio of 1.35 and the inflow C/Si ratio of 1.80 or more. These correspond to the case where the effective C/Si ratio is less than 1 and the case where the effective C/Si ratio is 1 or more, respectively.

In the vapor phase growth method according to the third embodiment, in the formation of the buffer film 501 having a high nitrogen concentration, the effective C/Si ratio on the surface of the wafer W is set to less than 1. Accordingly, it is possible to form the buffer film 501 having a high nitrogen concentration and a high uniformity of the nitrogen concentration in the surface of the wafer W. In addition, in the formation of the n-type film 502 having a low nitrogen concentration, the effective C/Si ratio on the surface of the wafer W is set to 1 or more. Accordingly, it is possible to form the n-type film 502 having a low nitrogen concentration and having a high uniformity of the nitrogen concentration in the surface of the wafer W.

Then, in forming the n-type film 502, the effective C/Si ratio on the surface of the wafer W is set to be 1 or more, so that it is possible to reduce the amount of carbon vacancies in the film. Since the effective C/Si ratio is 1 or more, the carbon exists in excess, and thus, the occurrence of carbon vacancies in the film is suppressed.

According to the vapor phase growth method according to the third embodiment, it is possible to form a silicon carbide film suitable for manufacturing high breakdown voltage devices such as transistors and diodes.

Heretofore, the embodiments of the invention have been described with reference to specific examples. The above-described embodiments are merely given as examples and do not limit the invention. In addition, the components of the embodiments may be appropriately combined.

In the embodiments, the case of forming the single crystal SiC film has been described as an example. However, the invention can be applied to formation of a polycrystalline SiC film or an amorphous SiC film.

In addition, in the embodiments, the single crystal SiC wafer has been described as an example of the substrate. However, the substrate is not limited to the single crystal SiC wafer.

In addition, in the embodiment, nitrogen has been described as an example of the n-type impurity. However, for example, phosphorus (P) may be applied as an n-type impurity.

In the embodiments, description in parts of apparatus configurations, manufacturing methods, and the like that are not directly required for the description of the invention is omitted, but the required apparatus configurations, manufacturing methods, and the like can be appropriately selected and used. Besides, all vapor phase growth apparatuses, annular holders, and vapor phase growth methods which include the elements of the invention and can be appropriately modified in design by those skilled in the art are included within the scope of the invention. The scope of the invention is defined by the appended claims and equivalents thereof.

What is claimed is:

1. A vapor phase growth method, comprising:
   rotating a substrate at a rotational speed of 300 rpm or more;
   heating the substrate;
   supplying a first process gas at a first flow rate toward the substrate;
   supplying a second process gas having a carbon/silicon atomic ratio higher than that of the first process gas at a second flow rate toward the substrate in a region on an outer side than a region being supplied with the first process gas; and
   forming a silicon carbide film on a surface of the substrate by forming a flow of the second process gas to be pulled in a direction toward a center of the substrate by controlling the first flow rate, the second flow rate, and the rotational speed.

2. The vapor phase growth method according to claim 1, wherein the first flow rate and the second flow rate are 0.2 m/sec or more and 1.0 m/sec or less.

3. The vapor phase growth method according to claim 1, wherein the second flow rate is 50% or more and 200% or less of the first flow rate.

4. The vapor phase growth method according to claim 1, wherein the substrate is heated at 1500° C. or more.

5. The vapor phase growth method according to claim 1, wherein the first process gas and the second process gas contain nitrogen.

* * * * *